(12) United States Patent
Alexander et al.

(10) Patent No.: US 7,027,991 B2
(45) Date of Patent: Apr. 11, 2006

(54) VOICE-RESPONSIVE COMMAND AND CONTROL SYSTEM AND METHODOLOGY FOR USE IN A SIGNAL MEASUREMENT SYSTEM

(75) Inventors: Jay A Alexander, Monument, CO (US); Michael J Karin, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 368 days.

(21) Appl. No.: 10/107,913

(22) Filed: Mar. 26, 2002

(65) Prior Publication Data

US 2002/0103651 A1    Aug. 1, 2002

Related U.S. Application Data

(63) Continuation of application No. 09/386,531, filed on Aug. 30, 1999, now abandoned.

(51) Int. Cl.
*G10L 15/24* (2006.01)

(52) U.S. Cl. ................................ 704/275; 704/257
(58) Field of Classification Search ................ 704/275, 704/270; 345/978
See application file for complete search history.

(56) References Cited

U.S. PATENT DOCUMENTS

| | | | |
|---|---|---|---|
| 4,677,569 A | | 6/1987 | Nakano et al. |
| 4,704,696 A | | 11/1987 | Reimer et al. |
| 5,476,010 A | * | 12/1995 | Fleming et al. ............... 73/620 |
| 5,544,654 A | | 8/1996 | Murphy et al. |
| 5,812,977 A | | 9/1998 | Douglas |
| 5,884,265 A | | 3/1999 | Squitteri et al. |

(Continued)

OTHER PUBLICATIONS

Electronic Engineering Times, Aug. 30, 1999, "Late News—Agilent to produce voice-driven scope.".

*Primary Examiner*—Abul K. Azad

(57) ABSTRACT

A speech-responsive command and control system and methodology for use in a signal measurement system, enabling an operator to control certain features and functions of the oscilloscope without using manual or graphical controls. A speech-responsive command and control system includes a speech recognition engine constructed and arranged to validate digital voice signals in accordance with an associated grammar file defining command and control utterances for controlling the signal measurement system. A voice controlled measurement system controller is also included. This controller is constructed and arranged to control the signal measurement system in response to text utterances validated by the speech recognition engine. The grammar may include rules defining acceptable command and control utterances suitable for controlling the signal measurement system. The speech recognition engine generates, for valid utterances, a text utterance representing the recognized utterance to the voice-controlled measurement system controller. The text utterance may be an ASCII string. In one embodiment, the system includes a natural language speech application interface. The NLSAI is constructed and arranged to parse the valid text utterances to generate command parameters included in the valid text utterances based upon a predetermined corpus comprising a list of all valid command an control utterances. A method for controlling a signal measurement system in response to voice commands is also disclosed. The method includes the steps of: 1) receiving a command utterance generated by the operator; 2) digitizing the command utterance; 3) determining whether the digitized command utterance is a valid command and control utterance; and 4) generating a system command to cause the signal measurement system to perform a function in response to the valid command and control utterance. Preferably, the method also includes the step of: 5) displaying the command utterance on a display operatively coupled to the signal measurement system.

36 Claims, 35 Drawing Sheets

U.S. PATENT DOCUMENTS

| | | | |
|---|---|---|---|
| 6,064,312 A * | 5/2000 | Weller | 340/653 |
| 6,138,098 A * | 10/2000 | Shieber et al. | 704/257 |
| 6,208,972 B1 * | 3/2001 | Grant et al. | 704/275 |
| 6,229,536 B1 * | 5/2001 | Alexander et al. | 345/440.1 |
| 6,353,313 B1 * | 3/2002 | Estep et al. | 324/160 |
| 6,384,591 B1 * | 5/2002 | Estep et al. | 324/111 |
| 6,456,972 B1 * | 9/2002 | Gladstein et al. | 704/257 |

* cited by examiner

FIG. 8A

| | COMMAND PROCESSOR | |
|---|---|---|
| | NAME | DESCRIPTION (THE COMMAND PROCESSOR CAUSES THE OSCILLOSCOPE SUBSYSTEM TO...) |
| Generic Group 850 | Undo Last Command | Perform the opposite of the last command, returning the oscilloscope to its previous state — 801 |
| | Run | Perform a measurement — 802 |
| | Stop | Cease performing a measurement — 803 |
| | Clear | Clear the display control region on the GUI — 804 |
| | Default Set-Up | Invoke a previously established default set-up — 805 |
| | Autoscale | Perform the autoscale function — 806 |
| | Zoom | Adjust horizontal scale by predetermined or indicated number of divisions in indicated direction — 807 |
| | Print | Print screen — 808 |
| | Help | Invoke help routine, displaying the help pull-down menu — 810 |
| | Save Screen | Save current screen to memory — 812 |
| | Save Waveform | Save current waveform display to memory — 813 |
| Horizontal Control Group 852 | Horizontal Delay Relative | Adjust horizontal delay (offset) by predetermined or indicated number of divisions in indicated direction — 814 |
| | Horizontal Delay Absolute | Change horizontal delay (offset) to indicated time — 815 |
| | Horizontal Scale Relative | Adjust horizontal scale by predetermined or indicated number of divisions in indicated direction — 816 |
| | Horizontal Scale Absolute | Change horizontal scale to indicated time/division — 817 |
| Delay Box Control Group 854 | Delayed Sweep Control | Perform or cease performing the magnification ("delayed box") function — 818 |
| | Delay Box Position Relative | Adjust delay box horizontal position (offset) by predetermined or indicated number of divisions in indicated direction — 819 |
| | Delayed Box Position Absolute | Change delay box position (offset) to indicated time — 820 |
| | Delay Box Size Relative | Adjust delay box size (horizintal extent) by predetermined or indicated number of divisions — 821 |
| | Delay Box Size Absolute | Change delay box size (horizontal extent) by indicated time span — 822 |
| Trigger Group 852 | Trigger Mode | Set trigger mode to indicated mode type — 823 |
| | Trigger Source | Set the input used for triggering to the indicated input — 824 |
| | Trigger Slope | Set the type of edge used by the trigger circuitry to indicated edge to identified type — 825 |
| | Trigger Sweep | Set the type of sweep used to trigger to oscilloscope to identified type — 826 |
| | Trigger Coupling | Change the trigger coupling to indicated type if in edge mode triggering — 827 |
| | Trigger Level Relative | Adjust the trigger level voltage by predetermined or indicated amount — 828 |
| | Trigger Level Absolute | Change the trigger level voltage to indicated voltage — 829 |

FIG. 8B

| | | COMMAND PROCESSOR | |
|---|---|---|---|
| | Name | DESCRIPTION (THE COMMAND PROCESSOR CAUSES THE OSCILLOSCOPE SUBSYSTEM TO...) | |
| Channel Control Group 858 | Channel Offset Relative | Adjust offset of selected channel by predetermined or indicated number of divisions in indicated direction | 830 |
| | Channel Offset Absolute | Change offset of selected channel to indicated voltage | 831 |
| | Channel Scale Relative | Adjust scale of selected channel by predetermined or indicated number of divisions in indicated direction | 832 |
| | Channel Scale Absolute | Change scale of selected channel to indicated volts/division | 833 |
| | Channel Coupling | Set selected channel to be coupled to indicated AC or DC | 834 |
| | Channel Impedance | Set selected channel impedance to indicated 50Ω or 1MΩ | 835 |
| | Channel Control | Turn selected on or off as indicated | 836 |
| | Channel Quick Measure | Perform quick measure function on selected channel | 837 |
| External Trigger Control Group 860 | External Trigger Range | Set the external trigger input to indicated volts/division | 838 |
| | External Trigger Coupling | Set the typr of coupling used for the external trigger to indicated AC or DC coupling | 839 |
| | External Trigger Impedence | Set the input impedance for the external trigger to indicated impedance | 840 |
| | External Trigger Control | turn external on or off as indicated | 841 |

FIG. 9A

| TYPE SELECTED<br>900A | TOKEN<br>219 | COMMAND PROCESSOR POINTER<br>930A | COMMAND MAP 714 | |
|---|---|---|---|---|
| | | POINTER | COMMAND PROCESSOR | |
| COMMON VOICE COMMANDS | undo | undolast | Undo Last Command | 901 |
| | run | run | Run | 902 |
| | stop | stop | Stop | 903 |
| | clear | clear | Clear | 904 |
| | defaultsetup | defaultsetup | Default Set-Up | 905 |
| | autoscale | autoscale | Autoscale | 906 |
| | phdelayrel | hdelayrel | Horizontal Delay Relative | 907 |
| | nhdelayrel | hdelayrel | Horizontal Delay Relative | 908 |
| | pdelayabs | hdelayabs | Horizontal Delay Absolute | 909 |
| | pdelayabsmill | hdelayabs | Horizontal Delay Absolute | 910 |
| | pdelayabsmicr | hdelayabs | Horizontal Delay Absolute | 911 |
| | pdelayabsnano | hdelayabs | Horizontal Delay Absolute | 912 |
| | pdelayabspico | hdelayabs | Horizontal Delay Absolute | 913 |
| | ndelayabs | hdelayabs | Horizontal Delay Absolute | 914 |
| | ndelayabsmill | hdelayabs | Horizontal Delay Absolute | 915 |
| | ndelayabsmicr | hdelayabs | Horizontal Delay Absolute | 916 |
| | ndelayabsnano | hdelayabs | Horizontal Delay Absolute | 917 |
| | ndelayabspico | hdelayabs | Horizontal Delay Absolute | 918 |
| | zoom | zoom | Zoom | 919 |
| | hscalerel | hscalrel | Horizontal Scale Relative | 920 |
| | delsweeponoff | delsweeponoff | Dleayed Sweep Control | 921 |
| | hscaleabs | hscaleabs | Horizontal Scale Absolute | 922 |
| | hscaleabsmill | hscaleabs | Horizontal Scale Absolute | 923 |
| | hscaleabsmicr | hscaleabs | Horizontal Scale Absolute | 924 |
| | hscaleabsnano | hscaleabs | Horizontal Scale Absolute | 925 |
| | hscaleabspico | hscaleabs | Horizontal Scale Absolute | 926 |
| | pdelboxposrel | delboxposrel | Delay Box Relative Position | 927 |
| | ndelboxposrel | delboxposrel | Delay Box Relative Position | 928 |
| | pdelboxposabs | delboxposabs | Delay Box Absolute Position | 929 |
| | pdelboxposabsmill | delboxposabs | Delay Box Absolute Position | 930 |
| | pdelboxposabsmicr | delboxposabs | Delay Box Absolute Position | 931 |
| | pdelboxposabsnano | delboxposabs | Delay Box Absolute Position | 932 |
| | pdelboxposabspico | delboxposabs | Delay Box Absolute Position | 933 |
| | ndelboxposabs | delboxposabs | Delay Box Absolute Position | 934 |
| | ndelboxposabsmill | delboxposabs | Delay Box Absolute Position | 935 |
| | ndelboxposabsmicr | delboxposabs | Delay Box Absolute Position | 936 |
| | ndelboxposabsnano | delboxposabs | Delay Box Absolute Position | 937 |
| | ndelboxposabspico | delboxposabs | Delay Box Absolute Position | 938 |
| | delboxsizeabs | delboxsizeabs | Delay Box Absolute Size | 939 |
| | delboxsizeabsmill | delboxsizeabs | Delay Box Absolute Size | 940 |
| | delboxsizeabsmicr | delboxsizeabs | Delay Box Absolute Size | 941 |
| | delboxsizeabsnano | delboxsizeabs | Delay Box Absolute Size | 942 |

FIG. 9B

| TYPE SELECTED | TOKEN | COMMAND PROCESSOR POINTER | |
|---|---|---|---|
| | | POINTER | COMMAND PROCESSOR |
| | delboxsizeabspico | delboxsizeabs | Delay Box Absolute Size — 943 |
| | delboxsizerel | delboxsizerel | Delay Box Absolute Relative — 944 |
| | trmodeedge | trmode | Trigger Mode — 945 |
| | trmodeglitch | trmode | Trigger Mode — 946 |
| | trmodeadv | trmode | Trigger Mode — 947 |
| | trline | trsource | Trigger Source — 948 |
| | trslopepos | trsource | Trigger Source — 949 |
| | trslopeneg | trsource | Trigger Source — 950 |
| | trauto | trsweep | Trigger Sweep — 951 |
| | trtriggered | trsweep | Trigger Sweep — 952 |
| | trsingle | trsweep | Trugger Sweep — 953 |
| | trcoupac | trcoup | Trigger Coupling — 954 |
| | trcoupdc | trcoup | Trigger Coupling — 955 |
| | trcouplf | trcoup | Trigger Coupling — 956 |
| | trcouphf | trcoup | Trigger Coupling — 957 |
| | ptrlevelabsmill | trlevelabs | Trigger Absolute Level — 958 |
| | ptrlevelabs | trlevelabs | Trigger Absolute Level — 959 |
| | ntrlevelabsmill | trlevelabs | Trigger Absolute Level — 960 |
| | ntrlevelabs | trlevelabs | Trigger Absolute Level — 961 |
| | ptrlevelrel | trlevelrel | Trigger Relative Level — 962 |
| | ntrlevelrel | trlevelrel | Trigger Relative Level — 963 |
| | Print | Print | Print Screen — 964 |
| | helpon | help | Help — 966 |
| | helpoff | help | Help — 967 |
| 900B | quickmeasoff | quickmeasoff | Quick Measure Control — 968 |
| | savescreen | savescreen | Save Screen — 969 |
| | savewaveform | savewaveform | Save Waveform — 970 |
| Channel 1 Voice Commands | pchloffrel | chXoffrel | Channel Offset Relative — 971 |
| | nchloffrel | chXoffrel | Channel Offset Relative — 972 |
| | chlvscaleabs | chXscaleabs | Channel Scale Absolute — 973 |
| | chlvscaleabsmill | chXscaleabs | Channel Scale Absolute — 974 |
| | pchloffabs | chXoffabs | Channel Offset Absolute — 975 |
| | pchloffabsmill | chXoffabs | Channel Offset Absolute — 976 |
| | nchloffabs | chXoffabs | Channel Offset Absolute — 977 |
| | nchloffabsmill | chXoffabs | Channel Offset Absolute — 978 |
| | chlscalerel | chXscalerel | Channel Scale Relative — 979 |
| | chlcoupling | chXcoupling | Channel Coupling — 980 |
| | chlimp | chXimp | Channel Impedance — 981 |
| | chlonoff | chXonoff | Channel Control — 982 |
| | chlquickmeas | chXquickmeas | Channel Quick Measure — 983 |

FIG. 9C

| TYPE SELECTED | TOKEN | COMMAND PROCESSOR POINTER | |
|---|---|---|---|
| | | POINTER | COMMAND PROCESSOR |
| Channel 2 Voice Commands 900C | pch2offrel | chXoffrel | Channel Offset Relative | 984
| | nch2offrel | chXoffrel | Channel Offset Relative | 985
| | ch2vscaleabs | chXscaleabs | Channel Scale Absolute | 986
| | ch2vscaleabsmill | chXscaleabs | Channel Scale Absolute | 987
| | pch2offabs | chXoffabs | Channel Offset Absolute | 988
| | pch2offabsmill | chXoffabs | Channel Offset Absolute | 989
| | nch2offabs | chXoffabs | Channel Offset Absolute | 990
| | nch2offabsmill | chXoffabs | Channel Offset Absolute | 991
| | ch2scalerel | chXscalerel | Channel Scale Relative | 992
| | ch2coupling | chXcoupling | Channel Coupling | 993
| | ch2imp | chXimp | Channel Impedance | 994
| | ch2onoff | chXonoff | Channel Control | 995
| | ch2quickmeas | chXquickmeas | Channel Quick Measure | 996
| Channel 3 Voice Commands 900D | pch3offrel | chXoffrel | Channel Offset Relative | 997
| | nch3offrel | chXoffrel | Channel Offset Relative | 998
| | ch3vscaleabs | chXscaleabs | Channel Scale Absolute | 999
| | ch3vscaleabsmill | chXscaleabs | Channel Scale Absolute | 901A
| | pch3offabs | chXoffabs | Channel Offset Absolute | 902A
| | pch3offabsmill | chXoffabs | Channel Offset Absolute | 903A
| | nch3offabs | chXoffabs | Channel Offset Absolute | 904A
| | nch3offabsmill | chXoffabs | Channel Offset Absolute | 905A
| | ch3scalerel | chXscalerel | Channel Scale Relative | 906A
| | ch3coupling | chXcoupling | Channel Coupling | 907A
| | ch3imp | chXimp | Channel Impedance | 908A
| | ch3onoff | chXonoff | Channel Control | 909A
| | ch3quickmeas | chXquickmeas | Channel Quick Measure | 910A
| Channel 4 Voice Commands 900E | pch4offrel | chXoffrel | Channel Offset Relative | 911A
| | nch4offrel | chXoffrel | Channel Offset Relative | 912A
| | ch4vscaleabs | chXscaleabs | Channel Scale Absolute | 913A
| | ch4vscaleabsmill | chXscaleabs | Channel Scale Absolute | 914A
| | pch4offabs | chXoffabs | Channel Offset Absolute | 915A
| | pch4offabsmill | chXoffabs | Channel Offset Absolute | 916A
| | nch4offabs | chXoffabs | Channel Offset Absolute | 917A
| | nch4offabsmill | chXoffabs | Channel Offset Absolute | 918A
| | ch4scalerel | chXscalerel | Channel Scale Relative | 919A
| | ch4coupling | chXcoupling | Channel Coupling | 920A
| | ch4imp | chXimp | Channel Impedance | 921A
| | ch4onoff | chXonoff | Channel Control | 922A
| | ch4quickmeas | chXquickmeas | Channel Quick Measure | 923A
| External Trigger Voice Commands 900F | exttrigrange | exttrigrange | External Trigger Range | 924A
| | exttrigcoupling | exttrigcoupling | External Trigger Coupling | 925A
| | exttrigimp | exttrigimp | External Trigger Impedance | 926A
| | trext | trext | External Trigger Control | 927A

VOICE-RESPONSIVE COMMAND AND CONTROL SYSTEM AND METHODOLOGY FOR USE IN A SIGNAL MEASUREMENT SYSTEM

This is a Continuation of application Ser. No. 09/386,531, filed on Aug. 30, 1999 now abandoned, the entire disclosure of which is incorporated herein by reference.

BACKGROUND OF THE INVENTION

1. Field of the Invention

The present invention relates generally to a signal measurement systems and, more particularly, to voice controlled signal measurement systems.

2. Related Art

Conventional signal measurement systems such as digital oscilloscopes sample, record and display time-varying analog signals. Samples of an input signal are taken and quantized, and the resultant digital representations are stored in a waveform memory under the control of a sampling clock. The acquired data may be subsequently read out as locations in memory are sequentially addressed by a clock signal to provide digital data that can be converted to a time-varying output signal for a waveform display. The sampling clock may be operated at one of several selectable rates depending upon the frequency content of the input signal. The selection of the portion of the analog input signal sampled and stored is determined by appropriate triggering circuitry to enable the operator to display the desired portion of the waveform.

Generally, as used herein the term "signal measurement system" includes any type of measurement system that receives and processes one or more signals. One common type of signal measurement system is test and measurement instruments, which broadly include analog and digital oscilloscopes, network analyzers, spectrum analyzers, logic analyzers, waveform recorders and the like.

A primary purpose of analog and digital oscilloscopes has been to sample signals generated by and between electronic components, circuits and sub-assemblies, referred to generally as the device under test, or DUT. With the advent of increasingly sophisticated DUTs, as well as a decrease in the size and a corresponding increase in the density of components included in DUTs, current probing needs, which generally require the simultaneous capturing of multiple signals, far exceed the capabilities of currently available oscilloscopes. This historic problem has become more pronounced since the introduction of surface-mount technology (SMT). SMT is currently the primary method by which electronic components are attached to printed circuit boards. Relative to its through-hole technology (THT) predecessor, SMT provides for the use of extremely small component packages and extremely high density interconnects between the components and the printed circuit board.

It is at times difficult and often impossible to probe such small components in such a high density interconnect environment using today's oscilloscopes. In most cases, probes can no longer be clipped to a component lead and left unattended while the operator operates the oscilloscope. Instead, operators must hold steadily with one hand one or more probes against the desired component leads, while operating the oscilloscope with the other hand. If this difficult task can be accomplished at all, the requisite diligence required to properly probe the DUT distracts significantly the operator's concentration on the oscilloscope and captured waveform data. Further, the inevitable intermittent contact between the probe and the component lead causing numerous probing errors. As a result, measurements are often performed repeatedly to insure accurate measurements are obtained. In addition, the probe often slips off of the lead during testing, coming into contact with multiple components or component leads, inadvertently and unknowingly shorting together two or more adjacent leads, damaging the system component being tested.

This has been a long-standing problem for oscilloscope operators, although it has become more pronounced in recent decades with the advent of SMT. Accordingly, a number of approaches have been developed over the years to overcome this recurrent problem of conventional oscilloscopes. For example, multiple operators are sometimes used to perform a single signal measurement operation. One operator would control the probe(s) while the other operator controlled the oscilloscope. The labor costs associated with performing such measurements increased accordingly.

Another approach has been to solder a lead to the component at which a measurement is desired. However, this approach is time consuming, exposes components to potential damage and often results in inaccurate measurements. In particular, when measuring high frequency signals, the addition of even the smallest solder and lead add a capacitance and/or inductance to the measured circuit, preventing accurate measurements.

A distantly related solution commonly found in many test environments has been some form of makeshift device to invoked oscilloscope operations. For example, solenoid driven arms activated by a simple foot switch have been used to advance an oscilloscope to the next measurement setting. However, at most such a makeshift approach are quite limited in operation, performing fixed measurement sequences characteristic of manufacturing environments. Such devices are ineffective in testing environments more commonly occurring in component and system design testing.

What is needed, therefore, is a mechanism that allows for the easy, single user operations of oscilloscopes and other signal measurement systems.

SUMMARY OF THE INVENTION

The present invention is a speech-responsive command and control system and methodology for use in a signal measurement system, enabling an operator to control certain features and functions of the oscilloscope without using manual or graphical controls.

A number of aspects of the invention are summarized below, along with different embodiments that may be implemented for each of the summarized aspects. It should be understood that the embodiments are not necessarily inclusive or exclusive of each other and may be combined in any manner that is non-conflicting and otherwise possible. It should also be understood that these aspects of the invention are exemplary only and are considered to be non-limiting.

In one aspect of the present invention, a voice controlled signal measurement system responsive to predetermined command and control utterances is disclosed.

In another aspect of the invention, a speech-responsive command and control system for use in a signal measurement system such as an oscilloscope is disclosed. The speech-responsive command and control system includes a speech recognition engine constructed and arranged to validate digital voice signals in accordance with an associated grammar file defining command and control utterances for controlling the signal measurement system. A voice controlled measurement system controller is also included. This controller is constructed and arranged to control the signal measurement system in response to text utterances validated by the speech recognition engine. The grammar may include rules defining acceptable command and control utterances suitable for controlling the signal measurement system. The speech recognition engine generates, for valid utterances, a text utterance representing the recognized utterance to the voice-controlled measurement system controller. The text utterance may be an ASCII string.

In one embodiment, the system includes a natural language speech application interface. The NLSAI is constructed and arranged to parse the valid text utterances to generate command parameters included in the valid text utterances based upon a predetermined corpus comprising a list of all valid command an control utterances.

In another embodiment, the system also includes a microphone that receives sound waves on which operator commands are carried, and that generates analog speech signals; and a speech digitizer that digitizes the analog speech signals to generate the digital voice signals.

In a still further aspect of the invention, a method for controlling a signal measurement system in response to voice commands is disclosed. The method includes the steps of: 1) receiving a command utterance generated by the operator; 2) digitizing the command utterance; 3) determining whether the digitized command utterance is a valid command and control utterance; and 4) generating a system command to cause the signal measurement system to perform a function in response to the valid command and control utterance. Preferably, the method also includes the step of: 5) displaying the command utterance on a display operatively coupled to the signal measurement system.

Step 3) may include the step of: a) comparing the digitized command utterance with a predetermined grammar comprising rules defining valid command and control utterances in certain embodiments. In other embodiments, step 4) may include the step of: a) obtaining signal measurement system state and configuration data as required to calculate command parameters of the system command.

Various embodiments of the present invention provide certain advantages and overcome certain drawbacks of the above and other conventional techniques. Not all embodiments of the present invention share the same advantages and those that do may not share them under the same or similar circumstances. This being the, the present invention provides numerous advantages, including those identified herein below.

An advantage of the system of the present invention is that the present invention enables the operator to control the signal measurement system without manual contribution, enabling the operator to use both hands to control the probes. This, in turn, reduces probing errors, risk of component damage and related drawbacks of conventional techniques.

Further, use of the present invention relaxes the physical constraints of having to be positioned directly in front of the oscilloscope display, which can be difficult in a crowded bench environment.

Further features and advantages of the present invention as well as the structure and operation of various embodiments of the present invention are described in detail below with reference to the accompanying drawings. In the drawings, like reference numerals indicate identical or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIGS. 8A and 8B are a table summarizing the operations performed by one embodiment of the command processors illustrated in FIG. 7;

FIGS. 9A–9C are a table of one embodiment of the command map illustrated in FIG. 7;

DETAILED DESCRIPTION

I. System Environment

The present invention is a speech-responsive command and control system and methodology for use in a signal measurement system, enabling an operator to control certain features and functions of the oscilloscope without using manual or graphical controls.

Figure 1:
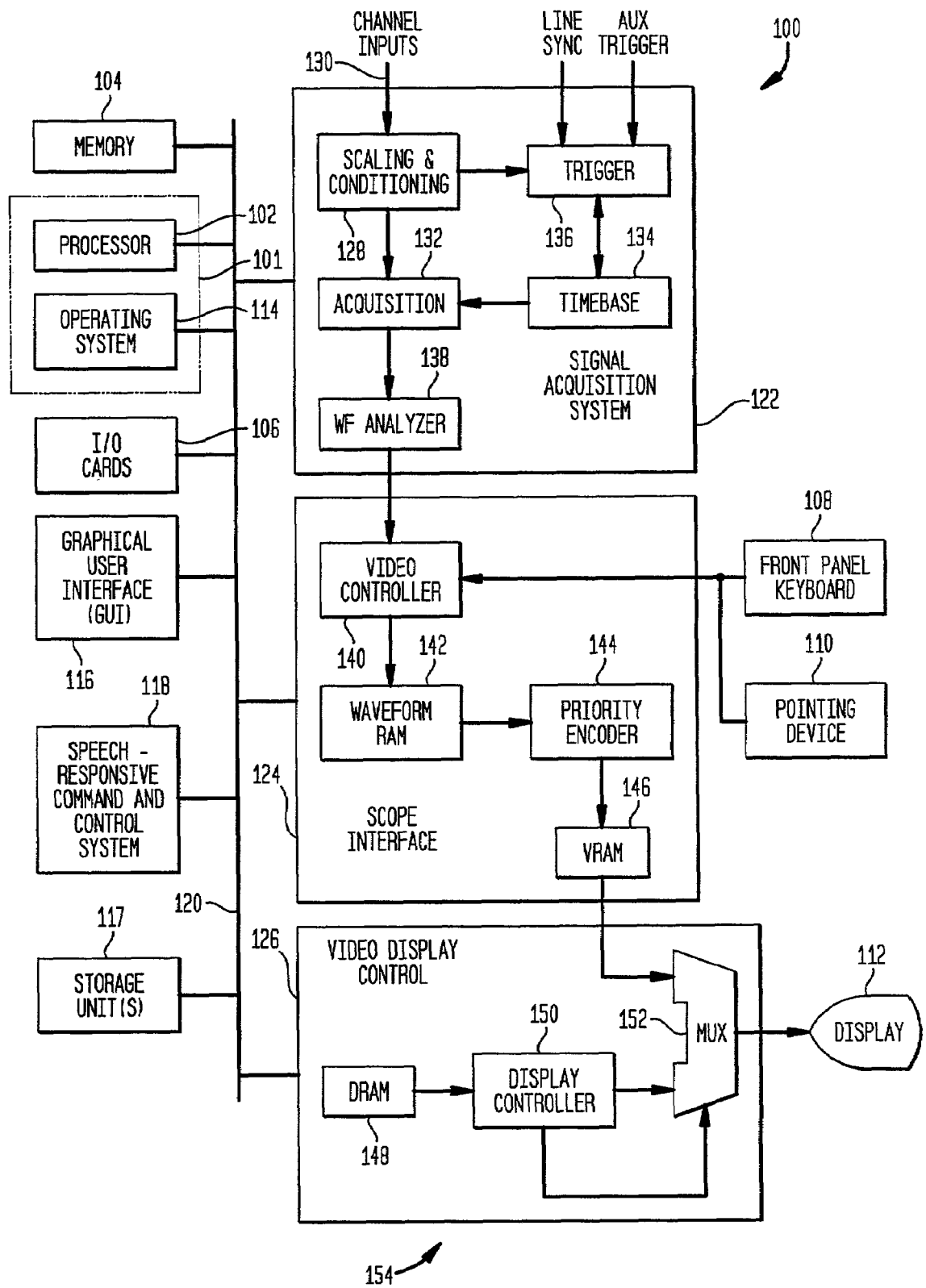
FIG. 1 is a functional block diagram of a digital oscilloscope suitable for implementing the speech-responsive command and control system and method of the present invention.

FIG. 1 is a functional block diagram of an exemplary digital oscilloscope suitable for implementing the present invention. Digital oscilloscope 100 is a commonly-available digital oscilloscope designed to acquire, analyze, and display a wide variety of signals generally in terms of signal voltage versus time. Although the present invention may be implemented in any oscilloscope, as will be described in detail below, digital oscilloscope 100 preferably includes a general purpose computer system on which software application programs may be executed, and integrated, specially programmed, special purpose hardware for performing signal acquisition, analysis and display functions.

Digital oscilloscope 100 includes a processor 102, a memory unit 104, input/output interface cards 106, storage units 117 such as a hard disk drive and a floppy disk drive, one or more input devices such as front panel keyboard 108 and pointing devices 110 and display 112. The memory 104 is used for storage of program instructions and for storage of results of operations performed by the processor 102. In one embodiment, memory 104 includes random access memory (RAM). Display 112 is preferably a liquid crystal display and is logically or physically divided into an array of picture elements referred to as pixels. Input/output interface cards 106 may be, for example, modem cards, network interface cards, sound cards, etc.

Processor 102 is typically a commercially available processor such as the Pentium microprocessor, PowerPC microprocessor, SPARC processor, PA-RISC processor or a 68000 series microprocessor. Many other processors are also available. Such a processor usually executes a program referred to as an operating system 114 such as the various versions of the Windows operating systems from Microsoft Corporation, the NetWare operating system available from Novell, Inc., or the Unix operating system available from many vendors such as Sun Microsystems, Inc. and Hewlett-Packard Company. Operating system 114 controls the execution of other computer programs such as a graphical user interface (GUI) 116 and the speech-responsive command and control system 118, and provides scheduling, input/output control, file and data management, memory management and related services. Processor 102 and operating system 114 define a computer platform represented by dashed block 101, for which application programs and high-level programming languages are written. The functional elements of digital oscilloscope 100 communicate with each other via one or more buses 120. Storage unit 117 may include disk drives, magnetic tape, solid state memory, bubble memory, etc.

With regard to the specially programmed, special purpose hardware for performing signal acquisition, analysis and display functions, digital oscilloscope 100 includes a signal acquisition sub-system 122, a scope interface sub-system 124 and a video display control sub-system 126. Signal acquisition sub-system 122 includes a scaling and conditioning unit 128 that receives input signals through channel inputs 130. Scaling and conditioning unit 128 and acquisition unit 132 include well-known high frequency electronics for signal acquisition, signal conditioning and analog-to-digital conversion, all of which are controlled by computer system 101 and are considered to be well-known in the art. Time base unit 134 drives the analog-to-digital process performed by acquisition unit 132, specifying when to sample the input signals and the number of samples to be taken. Trigger circuitry 136 synchronizes the acquisition process through time base 134, enabling the operator to arrange a trigger event to obtain a stable waveform display of the desired features of one or more of the input signals. Trigger circuitry 136 may be based upon a line sync or auxiliary trigger input as is well-known in the art.

A waveform analyzer 138 performs measurement processes for developing the waveform for display. Waveform analyzer 138 contains hardware and software components to perform well-known operations such as setting the analogto-digital codes for the acquisition unit 132 and mapping the resulting digital information to the physical pixel locations which are ultimately presented on display 112 under the control of graphical user interface 116. Pointing device 110 and/or keyboard 108 are used to move a cursor on the GUI-controlled display 112 to select display elements adjacent to or under the cursor. Pointing devices 110 may include any well-known pointing devices such as a mouse, track ball, joystick, touch screen, data glove, etc. The cursor may additionally be controlled with any one or more keyboards located externally or integrated into a front panel of digital oscilloscope 100.

A scope interface sub-system 124 includes a video controller 140 that controls the rendering of pixels into a waveform random access memory (RAM) 142. Video control sub-system 126 also receives display element control commands and cursor input information from front panel keyboard 108 and pointing device 110. Waveform RAM 142 includes a data structure for each pixel location on display 112. The data structures contain information regarding every display element that is to be drawn at each pixel location. Although there may be multiple display elements which are to be drawn at a given pixel location, only one color may be rendered at that location at any given time. Waveform RAM 142 supplies a priority encoder 144 with information regarding which display elements are to be displayed at each pixel location. Priority encoder 144 prioritizes the competing display elements. For example, if the operator arranged a marker and a waveform such that they are located in the same pixel location, then priority encoder 144 selects that display element which has the highest predetermined priority. In such an example, the color of the marker is preferably rendered at that pixel location providing a display that appears to show the marker over the competing waveform. Priority encoder 144 then sends the selected color to video RAM (VRAM) 146 which then causes the pixel to be rendered in the indicated color.

A video display control subsystem 126 includes a dynamic random access memory (DRAM) 148 which contains data specifying a color for each pixel in the display 112. Likewise, the VRAM 146 also contains data specifying a color for each pixel in the display 112. The above-noted computer-based system components control the information and DRAM 148 while signal acquisition system 122 controls the information 30 in VRAM 146. For each pixel in display 112, video display control subsystem 126 selects whether the pixel in display 112 is to be specified from VRAM 146 or DRAM 148. In general, information in VRAM 146 includes digitized waveforms being generated by signal acquisition sub-system 122 with high rates of change which are much too fast for software processing by computer system 101 for real-time display of the waveforms on display 112.

Video display control sub-system 126 includes a display controller 150 and a multiplexer 152. Controller 150 controls which of the two inputs to multiplexer 152 are processed into display signals for transmission to display 112 under the control of graphical user interface 116. Display controller 150 typically monitors color data send from DRAM 148 and may be programmed to switch multiplexer 152 to a different input once a particularly programmed color is received from DRAM 148. A rectangular pixel area is typically defined within DRAM 148 with the programmed color. The programmed color is not displayed but instead serves as a data path switch control for multiplexer 152. Therefore, within the programmed color rectangle, display data comes from VRAM 146. If various control functions are needed, an interactive dialog box may be drawn within the programmed color rectangle. This, as noted, prevents the information from the VRAM 146 from being displayed in the area occupied by the dialog box.

In one embodiment, speech-responsive command and control system 118 is implemented in software routines which interoperate with the components of the implementing computer-based system to perform voice control functions in accordance with the present invention. Such software routines typically reside in memory 104 and/or disk storage devices 117, and may be stored on any other computer-readable medium such as, for example, magnetic disk, compact disc or magnetic tape, and may be loaded into computer system 100 using an appropriate peripheral device as known in the art. Preferably, this embodiment of speech-responsive command and control system 118 is implemented in a well-known object-oriented programming language such as C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. Speech-responsive command and control system 118 may be implemented, for example, in dedicated hardware, firmware, or any combination thereof.

II. Speech-Responsive Command and Control System

A. General Functional Description

Speech-responsive command and control system 118 is a simple and intuitive apparatus and associated methodology that enables an operator to control oscilloscope 100 using voice commands only, thereby freeing the operators hands to control the probes, thereby facilitating the measurements of a device under test. A functional block diagram of one embodiment of speech-responsive command and control system 118 of the present invention implemented in digital oscilloscope 100 is illustrated in FIG. 2.

System 118 primarily includes a voice-controlled measurement system controller 202 that generates system control commands in response to voice commands uttered by the operator. A speech recognition engine 204 is included to determine if acceptable command and control commands have been uttered by the operator. In embodiments wherein a sufficient number of command and control utterances are to be provided, a natural language speech application interface (NLSAI) 206 is also included to parse valid utterances.

Figure 2:
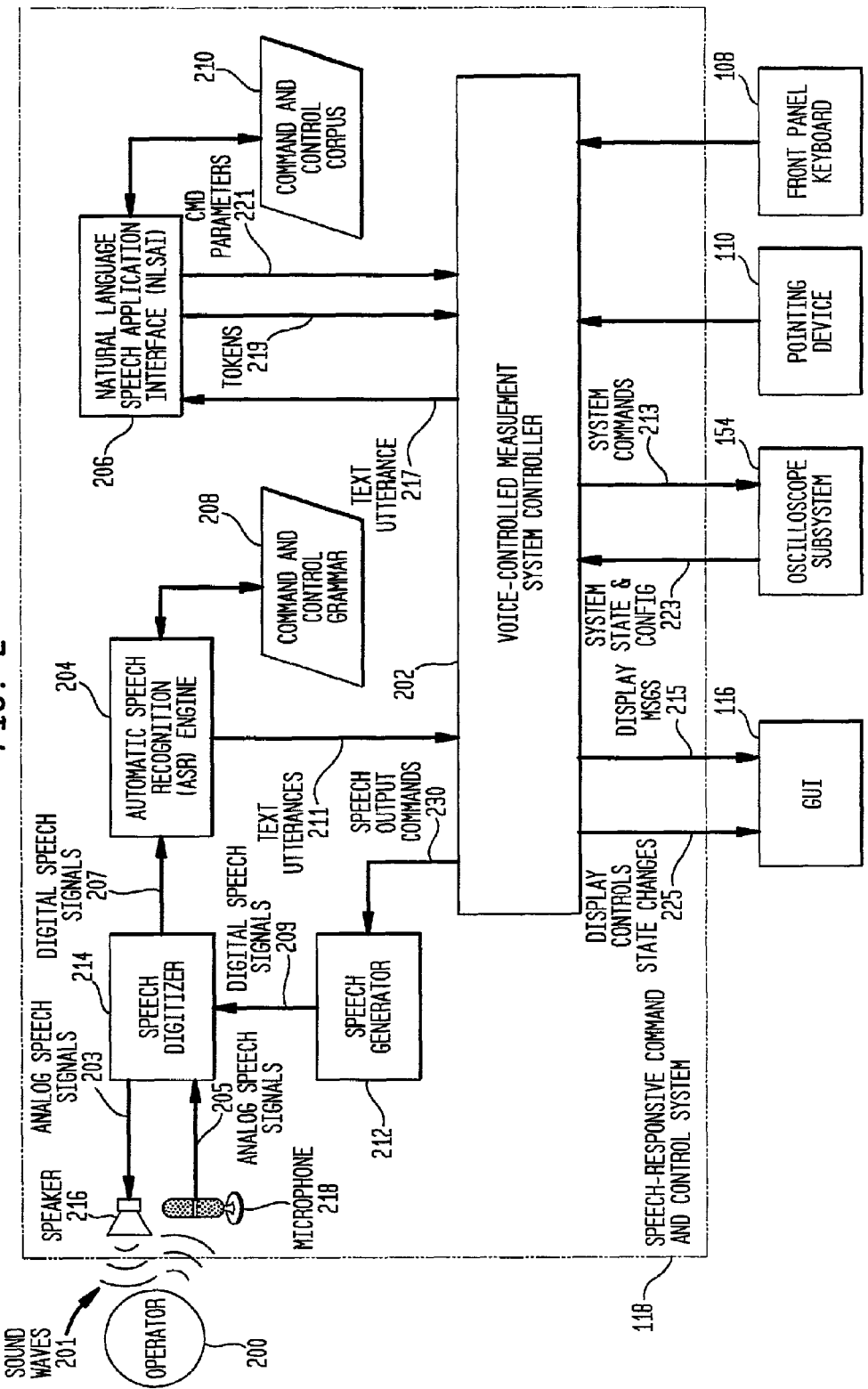
FIG. 2 is a functional block diagram of one embodiment of the speech-responsive command and control system of the present invention implemented in the digital oscilloscope illustrated in FIG. 1.

Referring to FIG. 2, a microphone 218 receives sound waves 201 on which operator commands are carried. Microphone 218 generates analog speech signals 205. A speech digitizer 214 receives and digitizes speech signals 205. As noted, this embodiment of the present invention is implemented in a signal measurement system having a standard computer platform, such as the digital oscilloscope 100 described above with reference to FIG. 1. In such embodiments, speech digitizer 214 may be any commercially available sound card now or later developed. It should be understood that in this and other applications of system 118, other devices for digitizing analog speech signals 205 may be used.

Digital speech signals 207 generated by speech digitizer 214 are provided to an automatic speech recognition (ASR) engine 204. Again, in the computer-based oscilloscope 100, ASR engine 204 is preferably a commercially available software package that can be readily installed on computer platform 101, such as any of those available from Lemout & Hauspie, Burlington, Mass., USA. Generally, ASR engine 204 implements signal processing techniques to examine digital speech signals 207. During this examination the digital data is compared to the contents of a predetermined command and control grammar 208 (simply, grammar 208) to determine whether a valid utterance was received.

Command and control grammar 208 includes rules defining acceptable utterances. In accordance with the present invention, command and control grammar 208 is limited specifically to commands that control the implementing signal measurement system, here digital oscilloscope 100. In one embodiment, grammar 208 is implemented in BNF format, although other formats may be used. "BNF" refers to a known context-free grammar notation of rules specifying the syntax of acceptable command and control utterances. BNF is easily parsed as compared to other grammar formats and, therefore is preferred. The contents of grammar 208 and the manner in which the grammar 208 is created is described in detail below.

If ASR engine 204 determines that the received utterance matches one of the rules defined by grammar 208, ASR engine 204 passes a textual representation of the recognized utterance, referred to herein as text utterance 211, to voice-controlled measurement system controller 202. In the illustrative embodiment, text utterance 211 is an ASCII string, although other formats may be used. The manner in which voice-controlled measurement system controller 202 processes text utterances 211 is described in detail below.

As noted, speech-responsive command and control system 118 may include a natural language (NL) speech application interface (SAI). In the embodiment illustrated in FIG. 2, an NLSAI 206 is operatively coupled to voice-controlled measurement system controller 202. As with ASR engine 204, in computer-based oscilloscope 100, NLSAI 211 is preferably a commercially available software package that can be readily installed on the computer platform 101. For example, in one embodiment, NLSAI 211 is a natural language processor available from Lemout & Hauspie, Burlington, Mass., USA.

Voice-controlled measurement system controller 202 passes text utterances 211 to NLSAI 206, as shown by text utterances signal 217. NLSAI 206 receives the recognized text utterance 217 and parses the utterance into its component parts using corpus 210. Natural language corpus 210 contains a list of all valid command an control utterances and, therefore, is referred to herein as command and control corpus 210. In one embodiment of speech-responsive command and control system 118 described below, corpus 210 includes a list of all possible utterances that may be used to control oscilloscope subsystem 154, along with associated tokens representing the type of command utterance, and optional associated variables, as described below.

Controller 202 generates one or more commands 213 to oscilloscope subsystem 154 in response to the valid command utterance. Preferably, associated display messages 215 are provided to graphical user interface 116 to render messages on display device 112 indicating the command that is being processed. This provides the operator with a visual feedback to verify proper receipt and implementation of the uttered command.

In addition, display controls state changes 225 are also provided to graphical user interface 116 to cause the associated buttons, software switches, check boxes, entry fields and the like to change state to reflect the change in the system commands 213 provided to oscilloscope subsystem 154.

As noted, ASR engine 204 and NLSAI 206 are preferably commercially available software applications. In certain embodiments, ASR engine 204 and NLSAI 206 are compiled together into a single executable program. In other embodiments, they are implemented as separate executable programs. In still further embodiments, they are implemented in a combination of dedicated hardware and firmware, application software, etc. Other implementation are considered to apparent to those of ordinary skill in the art.

It should also be understood that in the embodiment described herein, the associated grammar 208 and corpus 210 are created using tools provided by the vendors of the ASR engine 204 and NLSAI 206. In the above-noted embodiment, for example, these are created using a tool referred to as a Speech Application Toolkit (SAT) available from Lemout & Hauspie, Burlington, Mass., USA. Other techniques and devices for generating a user-defined command and control grammar and corpus appropriate for the implemented ASR engine 204 and NLSAI 206 may also be used.

In certain embodiments, the operator may receive audio feedback of the command. In such embodiments, a commercially available speech generator 212 is implemented in speech-responsive command and control system 118. Speech-responsive measurement system controller 202 generates speech output commands 230 that are received by speech generator 212. Speech generator 212 generates digital speech signals 209 in response. Speech digitizer 214 converts the digital speech signals 209 to analog speech signals 203 which are provided to a speaker 216.

In should be noted that ASR engine 204 is a command and control speech recognition engine and, therefore, has a limited vocabulary. This limited vocabulary makes ASR engine 204 speaker and gender independent. This is an important attribute in digital oscilloscopes such as that described with reference to FIG. 1 since it is often the case that the same person does not always use the same oscilloscope. Further, it enables the digital oscilloscope to be implemented in noisy environments. Most importantly, the voice control engine does not have to be trained for a particular operator, making the voice-controlled oscilloscope 100 easy to incorporate into an individual's testing protocols.

B. General Processes

Figure 3:
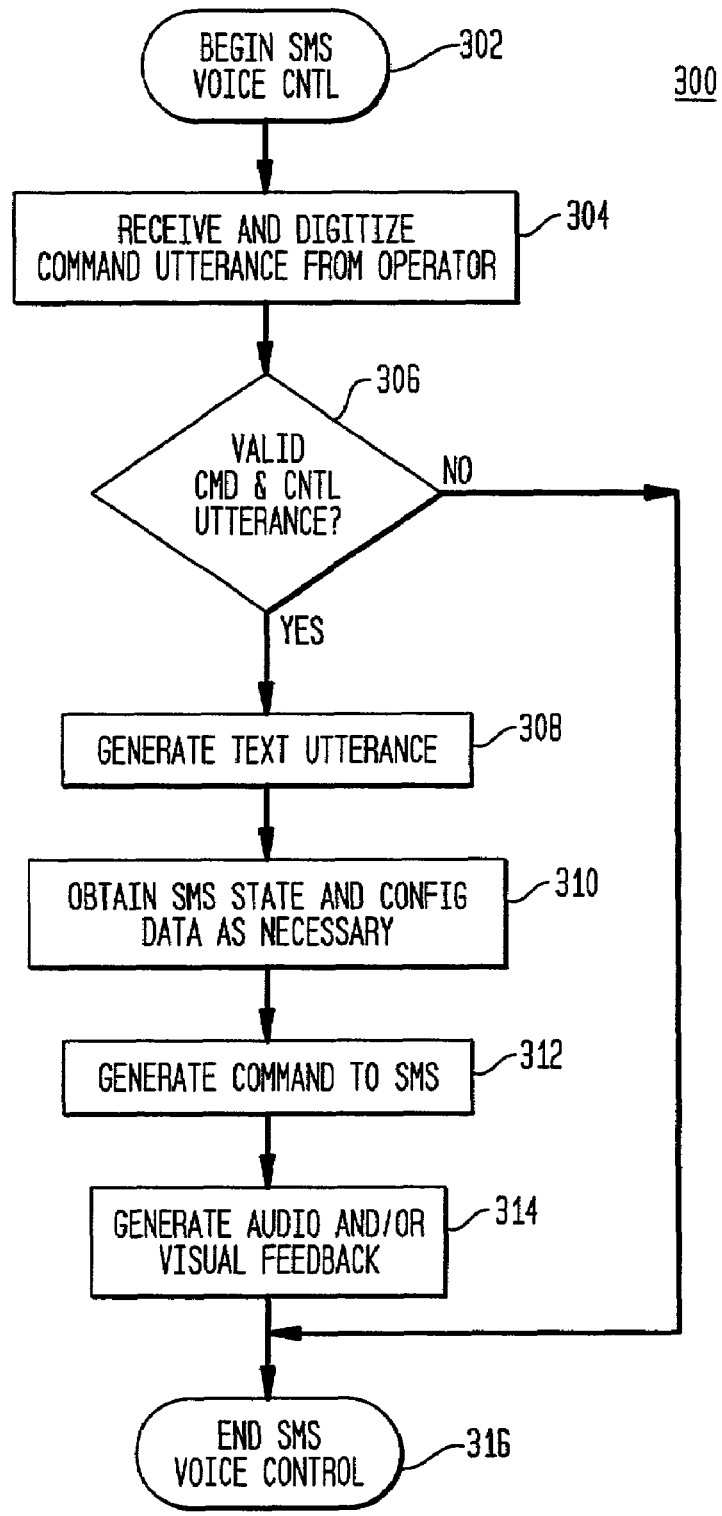
FIG. 3 is a high-level flowchart of the processes performed by a speech-responsive command and control system in accordance with one embodiment of the present invention.
Figure 4A:
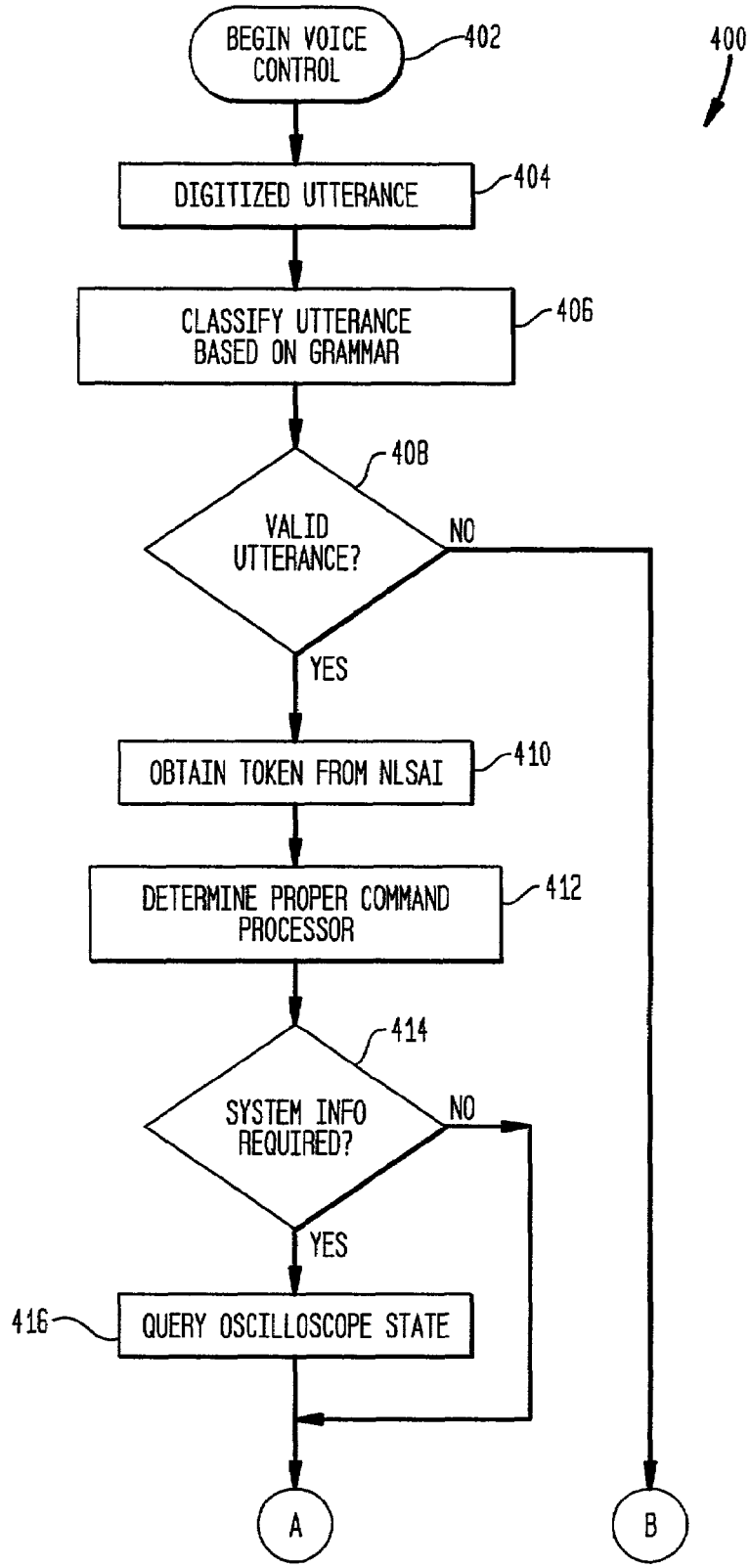
FIGS. 4A and 4B are a detailed flowchart of the processes identified in FIG. 3 in accordance with another embodiment of the present invention.
Figure 4B:
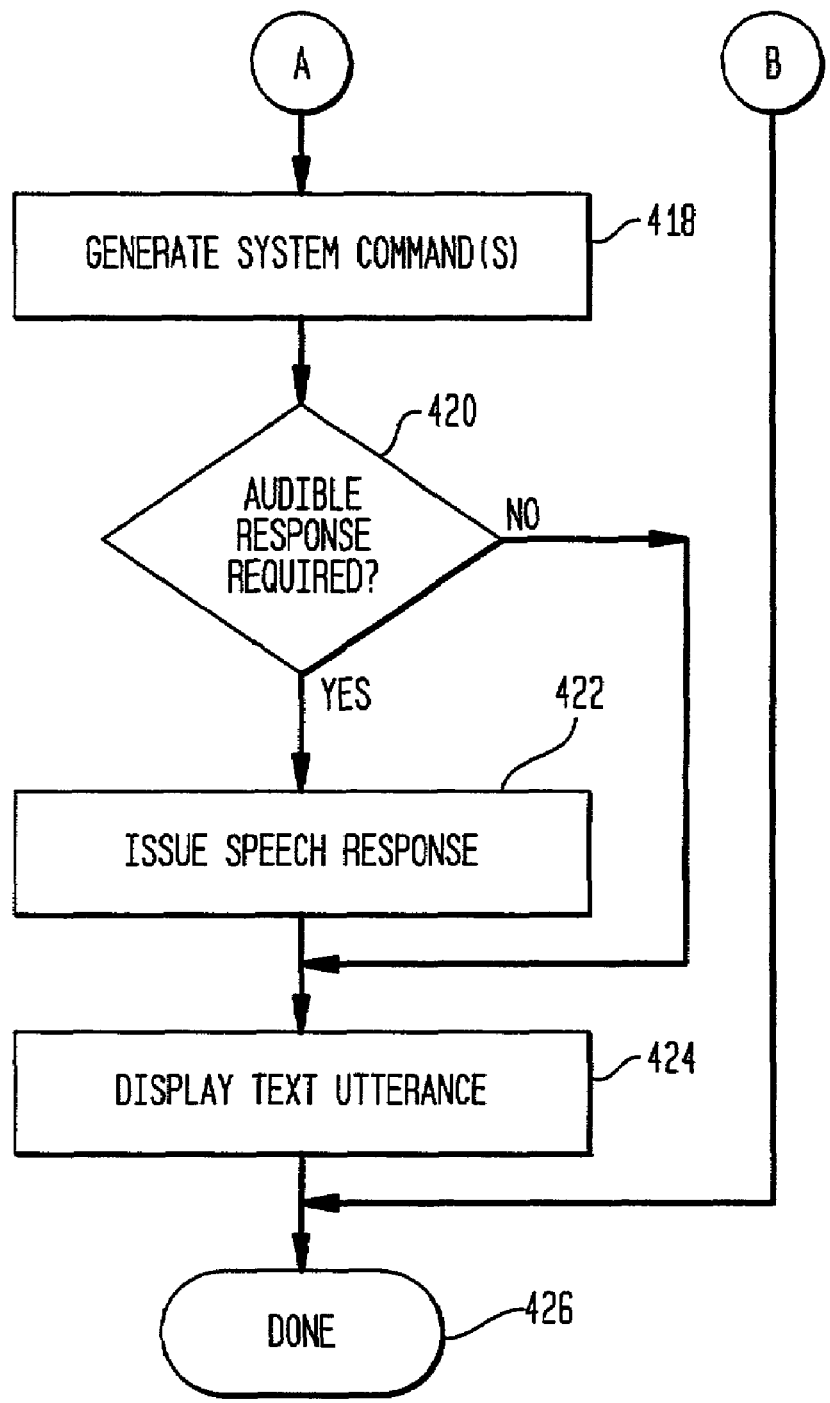

FIG. 3 is a high-level flowchart of the processes performed by a speech-responsive command and control system in accordance with one embodiment of the present invention. FIGS. 4A and 4B are a detailed flowchart of the processes identified in FIG. 3 in accordance with another embodiment of the present invention.

Referring to FIG. 3, signal measurement system voice control processing 300 begins at begin block 302 upon graphical or oral invocation of speech-responsive command and control system 118. At block 304 a command utterance generated by the operator is received and digitized.

At block 306 it is determined whether the received text utterance is a valid command based on a preestablished command and control grammar. If so, then the corresponding text utterances is generated at block 308.

To generate the appropriate command for the valid text utterance, the state and/or the configuration of the oscilloscope 100 may be required. For such commands, at block 310 the state and configuration of the implementing signal measurement system (SMS) is obtained.

With the requisite information and validated utterance, a command to the implementing digital oscilloscope 100 is generated at block 312. In certain preferred embodiments, visual feedback is provided by displaying the command on a display operatively coupled to the digital oscilloscope. In the embodiment illustrated in FIG. 1, for example, the graphical user interface 116 would be instructed to generate the appropriate display. In those embodiments where implemented, audio feedback is also provided at block 314. Voice control processing then ceases at end block 316.

Referring to the detailed flowchart of FIGS. 4A and 4B, voice control process 400 is implemented in one embodiment of speech-responsive command and control system 118 wherein multiple command processors are implemented to process specific types of command utterances and to generate appropriate system commands to oscilloscope subsystem 154 in response thereto. Signal measurement system voice control processing 400 begins at begin block 402 upon graphical or oral invocation of speech-responsive command and control system 118. At block 404 a command utterance generated by the operator is digitized. At block 406 the utterance is classified based on a command and control grammar including rules defining the valid command utterances for oscilloscope 100.

At block 408 it is determined whether the received text utterance is a valid command based on the preestablished command and control grammar. If not, then processing ceases at end block 426. Otherwise, the utterance is provided to a natural language engine where it is compared to a preestablished corpus of all possible utterances, and is parsed to extract the command parameters. In this particular embodiment, a token associated with the valid text utterance is obtained from the NLSAI at block 410.

Based on this token, the appropriate command processor is determined at block 412. If the identified command processor requires system state or configuration information to generate the appropriate system command, block 414, then oscilloscope subsystem 154 is queried at block 416 for the requisite information. With the requisite information, if any, and the parsed command parameters, system command (s) are generated at block 418.

If audible response is required, block 420, then a speech response is issued at block 422. Otherwise, in certain embodiments block 424 is performed to provide visual feedback by displaying the command utterance on display 112 operatively coupled to digital oscilloscope 100. Voice control processing then ceases at end block 426.

C. Voice-Controlled Measurement System Controller

Figure 5:
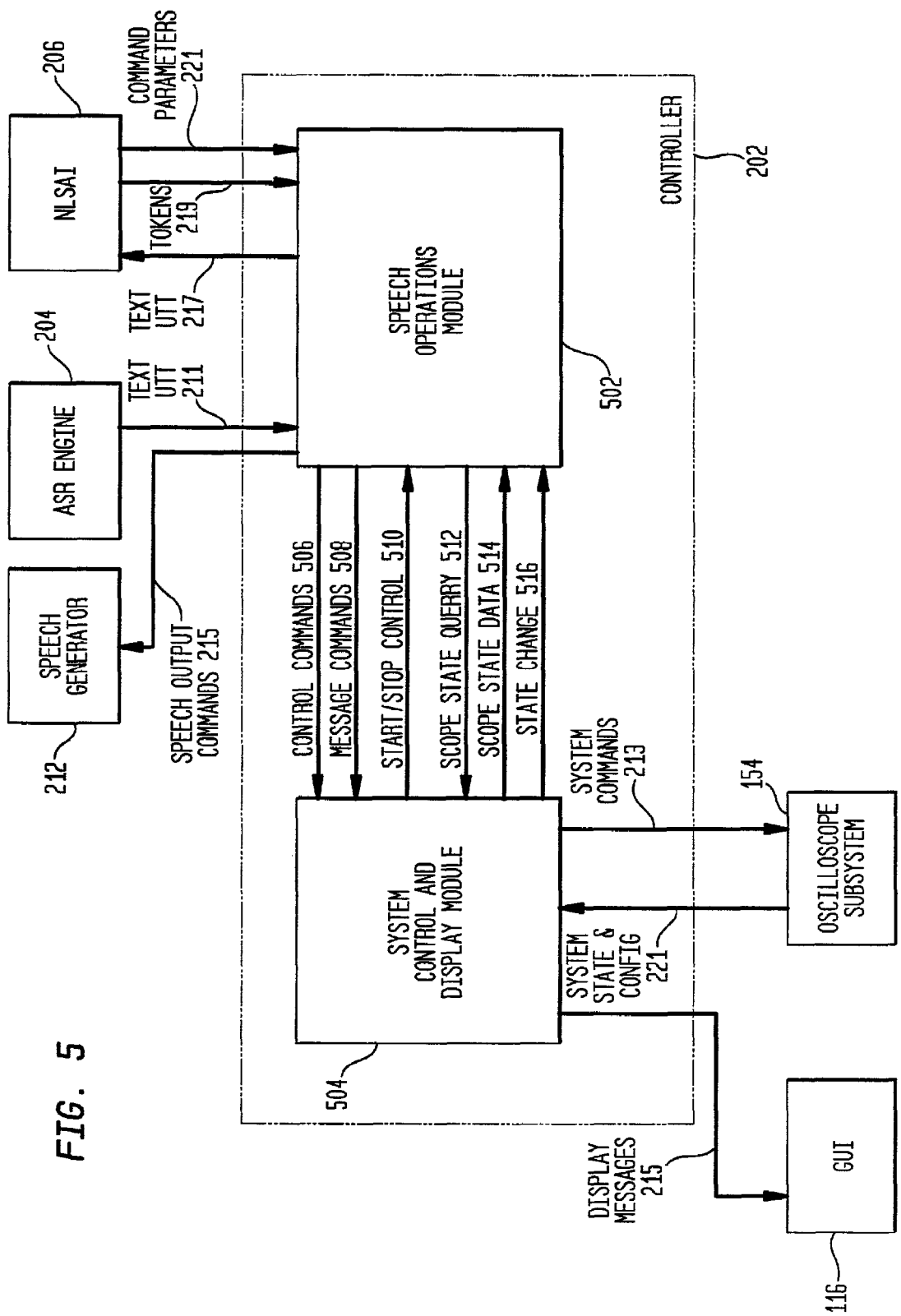
FIG. 5 is a function block diagram of one embodiment of the voice-controlled measurement system controller illustrated in FIG. 2.

FIG. 5 is a function block diagram of one embodiment of voice-controlled measurement system controller 202 illustrated in FIG. 2. In this embodiment, voice-controlled measurement system controller 202 includes a speech operations module 502 and a system control and display module 504. Speech operations module 502 performs the above-noted functions associated with the receipt and processing of command utterances. System control and display module 504, on the other hand, manages oscilloscope subsystem 154 and graphical user interface 116. In this embodiment, speech operations module 502 interoperates with graphical user interface 116 and oscilloscope subsystem 154 through system control and display module 504. In one embodiment, the interface between speech operations module 502 and system control and display module 504 is implemented with a common object model interface, although other interface techniques and application program interfaces (APIs) may be used.

System control and display module 504 receives operator activation/deactivation of voice-controlled measurement system controller 202 through graphical user interface 116 and generates a start/stop control signal 510 in response thereto. Speech operations module 502 generates control commands 506 for forwarding to oscilloscope subsystem 154 as system commands 213. Message commands 508 are also generated by speech operations module 502 for display on graphical user interface 116 by system control and display module 504. This is represented by Display Messages 215 in FIG. 5.

To obtain information regarding oscilloscope subsystem 154, speech operations module 502 generates scope state query 512 which is used by system control and display module 504 to retrieve system state and configuration information 221 from oscilloscope subsystem 154. This may also include state change information 516, as described below.

It should be understood that in one embodiment, speech operations module 502 and system control and display module 504 are implemented as separate executable software programs. In an alterative embodiment, the two modules 504 and 502 are implemented as a single executable program for execution on processor 101. It should also be understood that modules 502 and 504 may be implemented in other arrangements suitable for enabling the present invention to operate with a conventional operating system 114 and graphical user interface 116. In other aspects of the present invention, operating system 114 incorporates the functionality of the present invention while in a still further aspect, graphical user interface 116 incorporates the functionality of modules 502 and 504. It follows, then, that in other alternative embodiments, the functionality of the present invention may be distributed between graphical user interface 116, operating system 114 and other programs in various manners. Achieving these various alternative implementations is considered to be apparent to those of ordinary skill in the relevant arts and, therefore, are not described further herein.

D. Exemplary Display

Figure 6:
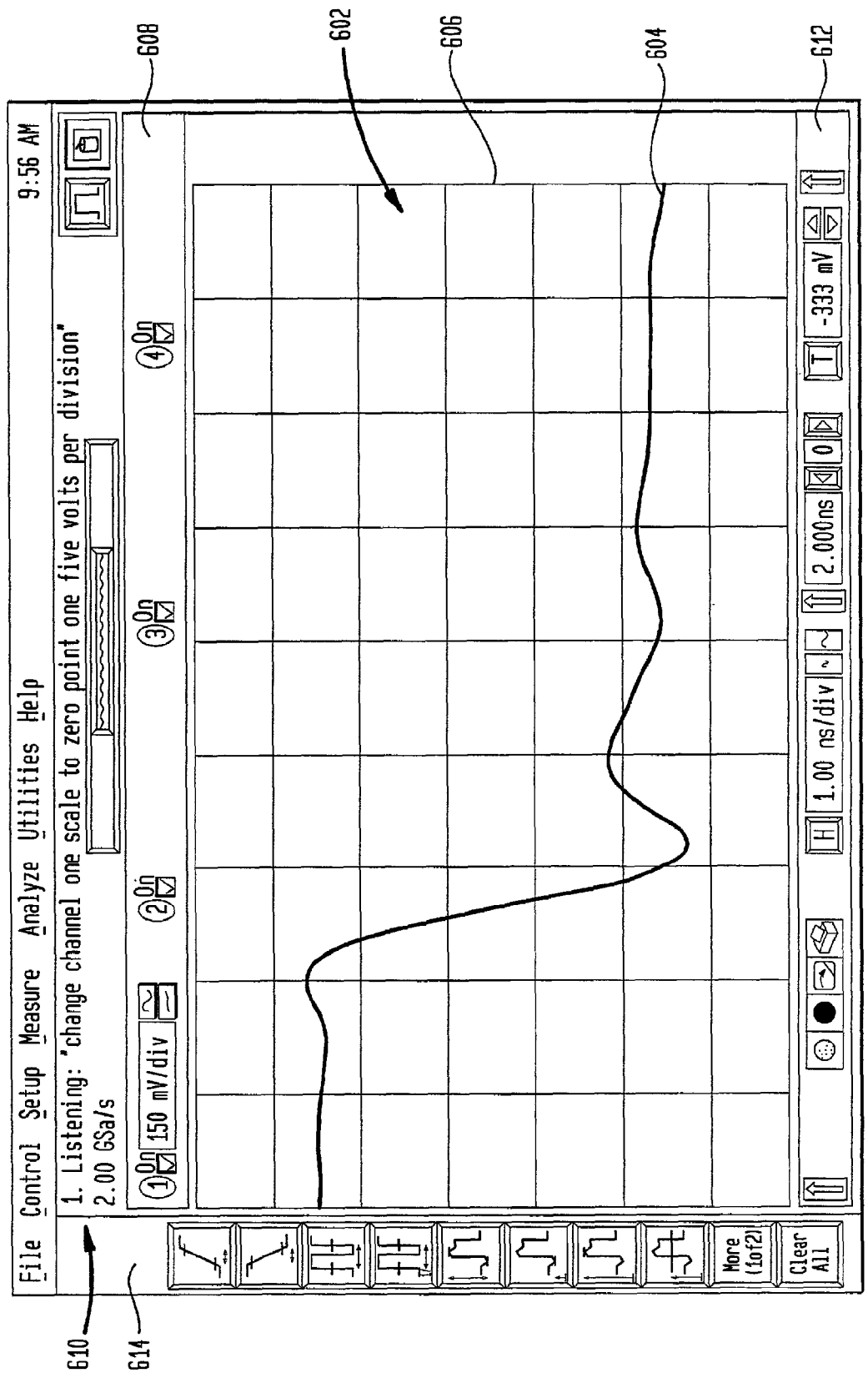
FIG. 6 is a display generated by a graphical user interface in accordance with one embodiment of the present invention.

FIG. 6 is an exemplary display 600 generated by graphical user interface 116 on display device 112. A waveform display region 602 is provided on which waveforms 604 are displayed over a background graticule 606. Measurement toolbars 608 and 614 surround the periphery of waveform display 602. Above toolbar 608 is a message display region 610 in which display messages are presented to the operator. In is within this display region 610 that messages associated with the voice control of digital oscilloscope 100 are rendered in accordance with certain embodiments of the present invention.

As shown in FIG. 6 a display message of "Listening:" is illustrated when speech-responsive command and control system 118 is in an active listening state. Alternatively, system 118 may be in a paused state at which time the display message is "Listening paused." It should be understood, however, that to enable the operator to turn system 118 on orally, system 118 is constantly listening for utterances. When in the suspended listening mode, the system 118 will convert to active listening when the utterance 'start listening" is received. Conversely, when, during the listening mode of operation, the operator utters "stop listening," the system 118 ceases active listening and enters the suspended listening mode.

In the illustrative embodiment illustrated in FIG. 6, the display message is "Listening: change channel one scale to zero point one five volts per division". This provides the operator with the ability to determine whether the uttered command was received and recognized as a valid command.

E. Speech Operations Module 502

Figure 7:
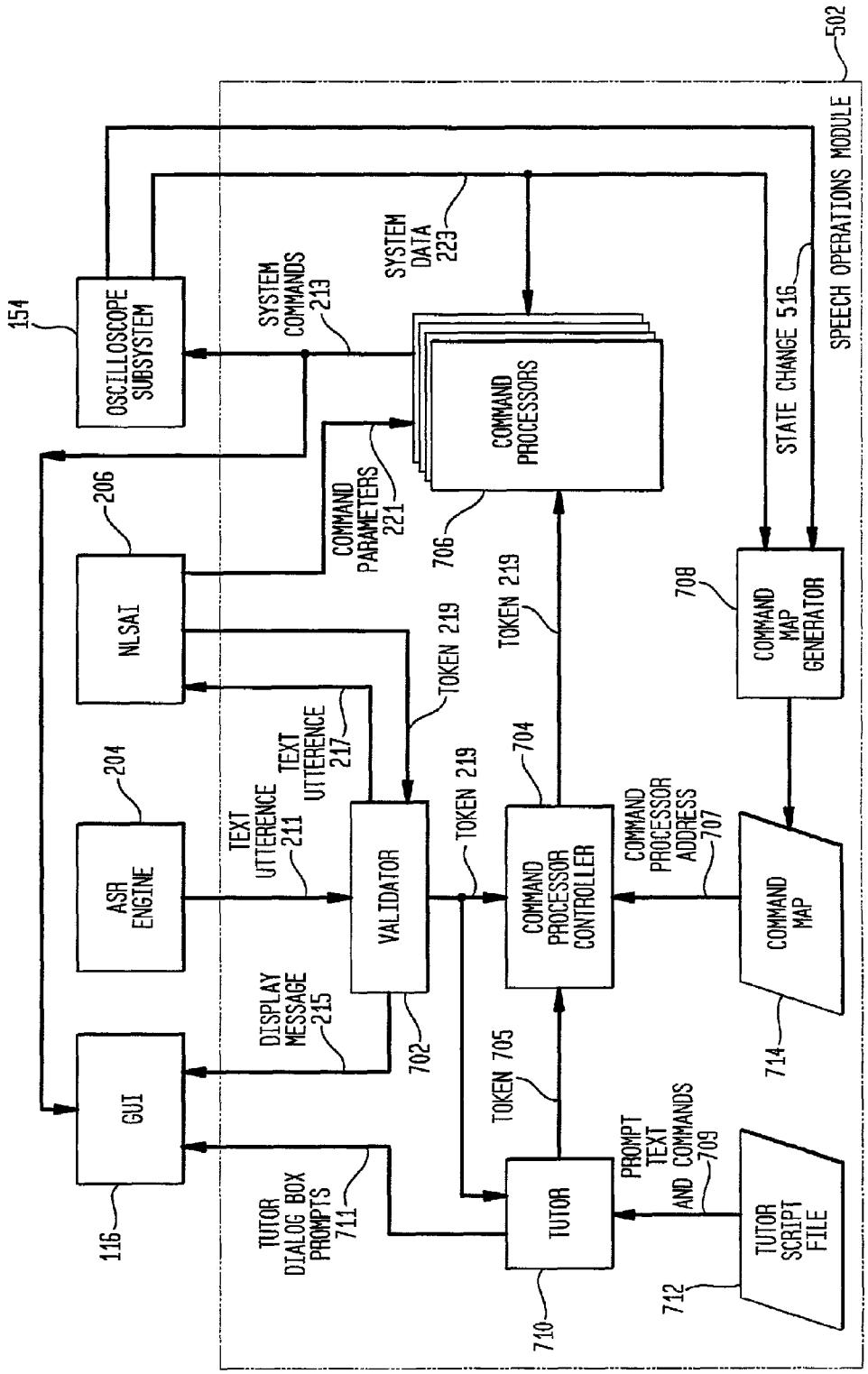
FIG. 7 is a functional block diagram of one embodiment of the speech operations module illustrated in FIG. 5.

FIG. 7 is a functional block diagram of one embodiment of the speech operations module 502 illustrated in FIG. 5. For ease of illustration, speech operations module 502 is illustrated in FIG. 7 as interfacing directly with graphical user interface 116, ASR engine 204, NLSAI 206 and oscilloscope subsystem 154. However, it should be understood that the following description applies equally to embodiments of the invention wherein speech operations module 502 communicates indirectly with such devices through system control and display module 504, as described above with reference to FIG. 5.

Referring to FIG. 7, speech operations module 502 includes primarily a validator 702, command processor controller 704 and a plurality of command processors 706. Validator 702 receives text utterance 211 from ASR engine 204. Validator 702 provides the text utterance 217 to NLSAI 206 for parsing and for confirmation that the command utterance 217 is one of the commands appropriate for controlling oscilloscope 100. NLSAI 206 returns to validator 702 a token 219 corresponding to, and representative of, the command text utterance 217. Validator 702 forwards token 219 to command processor controller 704 and performs other processes described below with reference to FIGS. 10A and 10B.

Command processor controller 704 accesses a predefined command map 714 to determine which command processor 706 is appropriate for processing the received token 219. In the illustrative embodiment, there are a plurality of command processors 706, each configured specifically to process certain one or more tokens, generating the corresponding system command 213. Command processors 706 are described in detail below.

Command map 714 associates all tokens 219 that can be generated by NLSAI 206 with a command processor 706 designed to process the token representation 219.

Command map 714 is generated by a command map generator 708 when system 118 is initialized. As will be described in detail below, in certain embodiments, the contents of command map 714 may be dependent upon the type of oscilloscope subsystem 154; that is, command map 714 may be specifically tailored for the implementing oscilloscope 100.

The invoked command processor 706 processes token 219 to generate system commands 213 to cause oscilloscope subsystem 154 to perform certain operations, and, where appropriate, to change the front panel display to indicate a change in system state. System commands 213 is also provided to GUI 116 so that, where appropriate, they also cause GUI 116 to alter the display of display elements to indicate a change in system state. To generate system state commands 213, command processors 706 at times require command parameters 221 and system state information. As such, command processors 706 access NLSAI 206 for command parameters 221, if any, and oscilloscope subsystem 154 for system data 223, if any, to generate system command 213.

Figure 11:
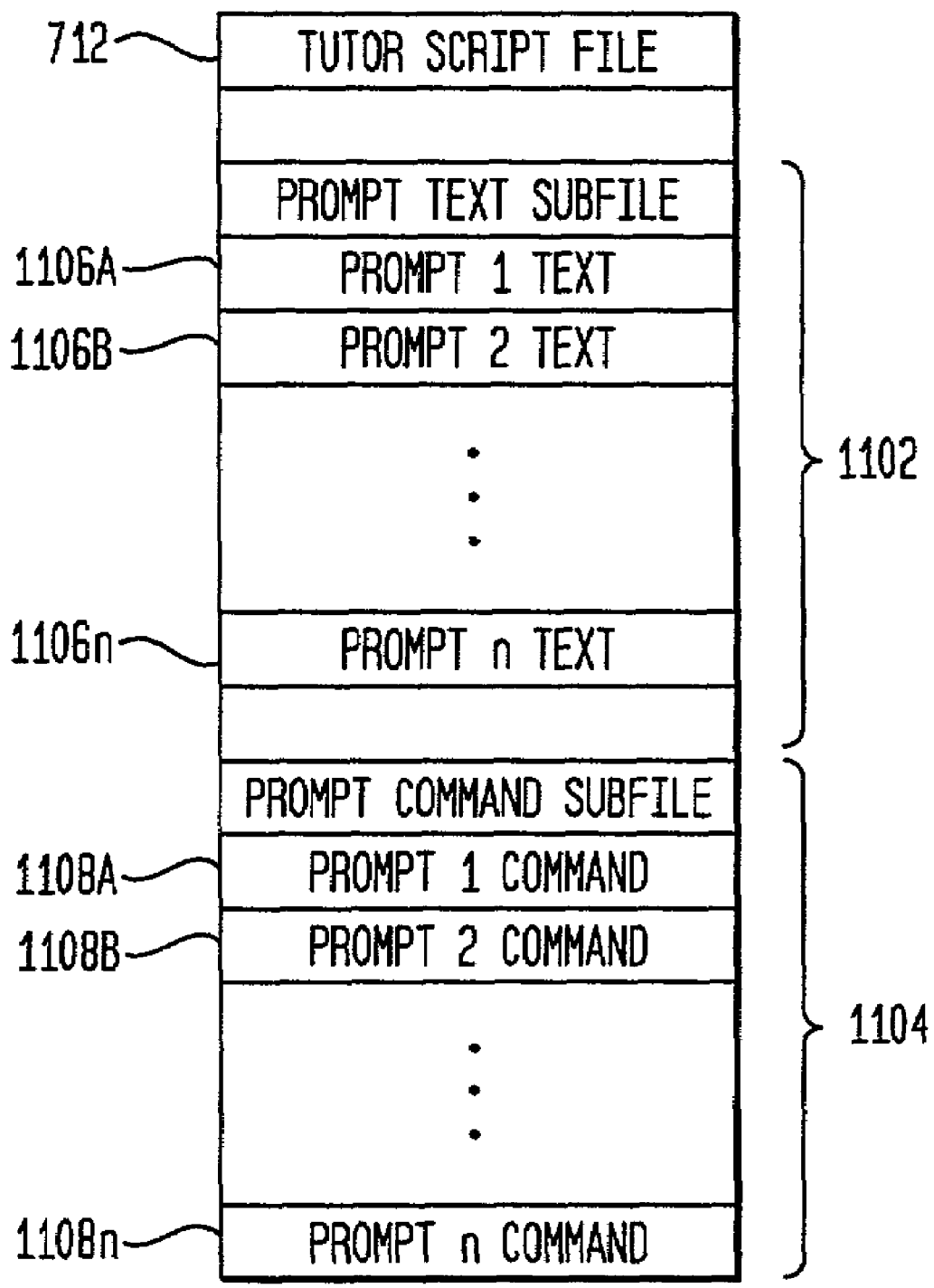
FIG. 11 is an illustration of the tutor script file illustrated in FIG. 7.

A tutor 710 is also included in speech operations module 502. Tutor 710, when operational, displays prompts to the operator on graphical user interface 116 requesting that the operator speak, uttering specific commands. Tutor 710 determines whether the proper command utterance was received through receipt of token 219. If the correct command utterance was received, then token 219 is forwarded as a token 705 to command processor controller 704 for normal processing and a display message is presented on the graphical user interface 116 to provide positive feedback to the operator and to continue to the next prompt. The prompts for tutor 710 are located in a tutor script file 712, an illustration of which is provided in FIG. 11. As shown therein, tutor script file 712 includes a prompt text subfile 1102 with a series of prompts 1106 and a prompt command subfile 1104 in which a series of prompt commands 1108 are stored. Tutor 710 steps through tutor script file 712, selecting sequentially each prompt text 1106 and corresponding prompt command 1108 for display in a tutor display box presented to graphical user interface 116. With each successful utterance, tutor 710 advances to the next sequential prompt text 1106 and prompt command 1108.

(1) Validator

Figure 10A:
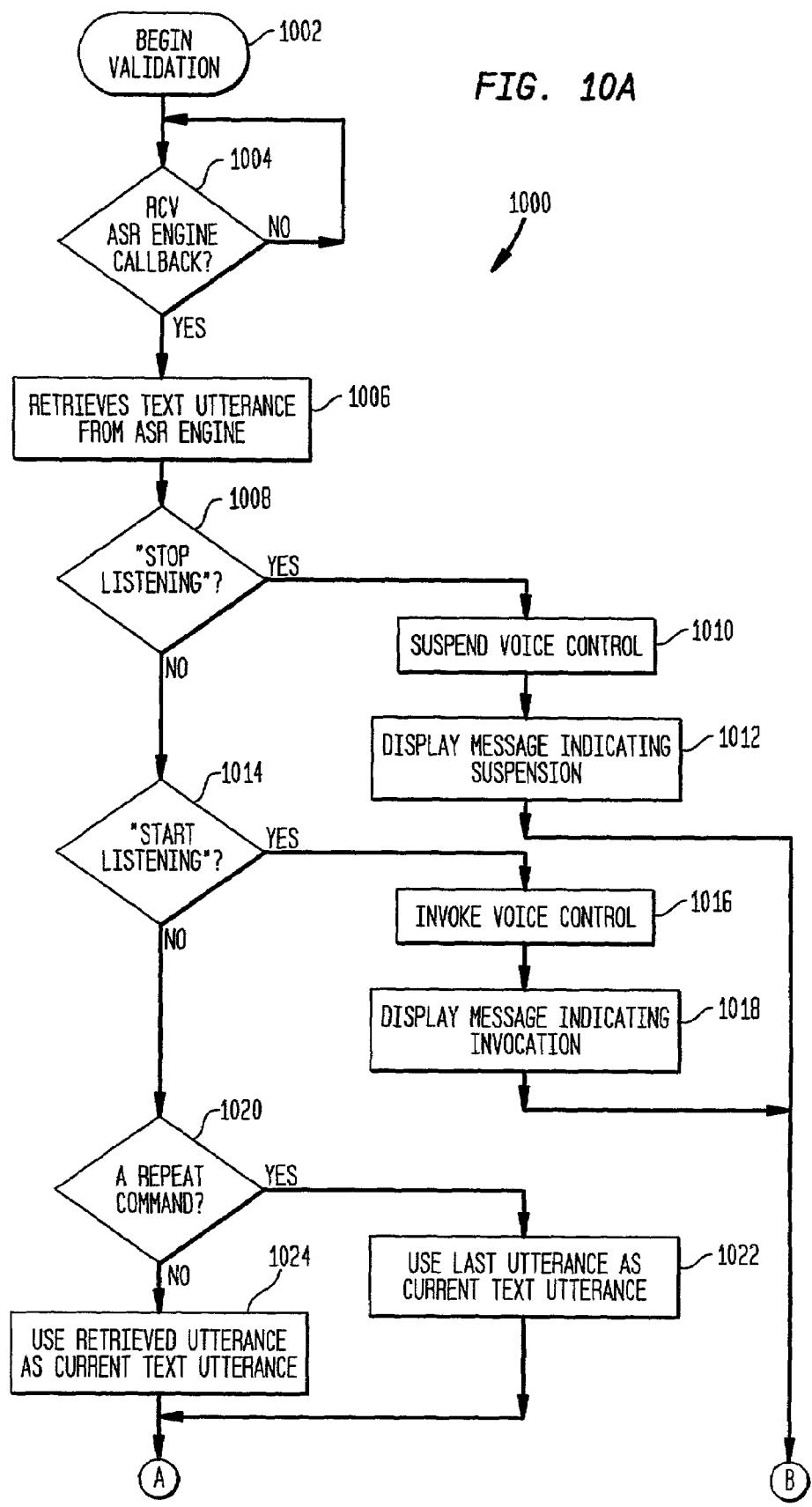
FIGS. 10A and 10B are a flowchart of processes performed by one embodiment of the validator illustrated in FIG. 7.
Figure 10B:
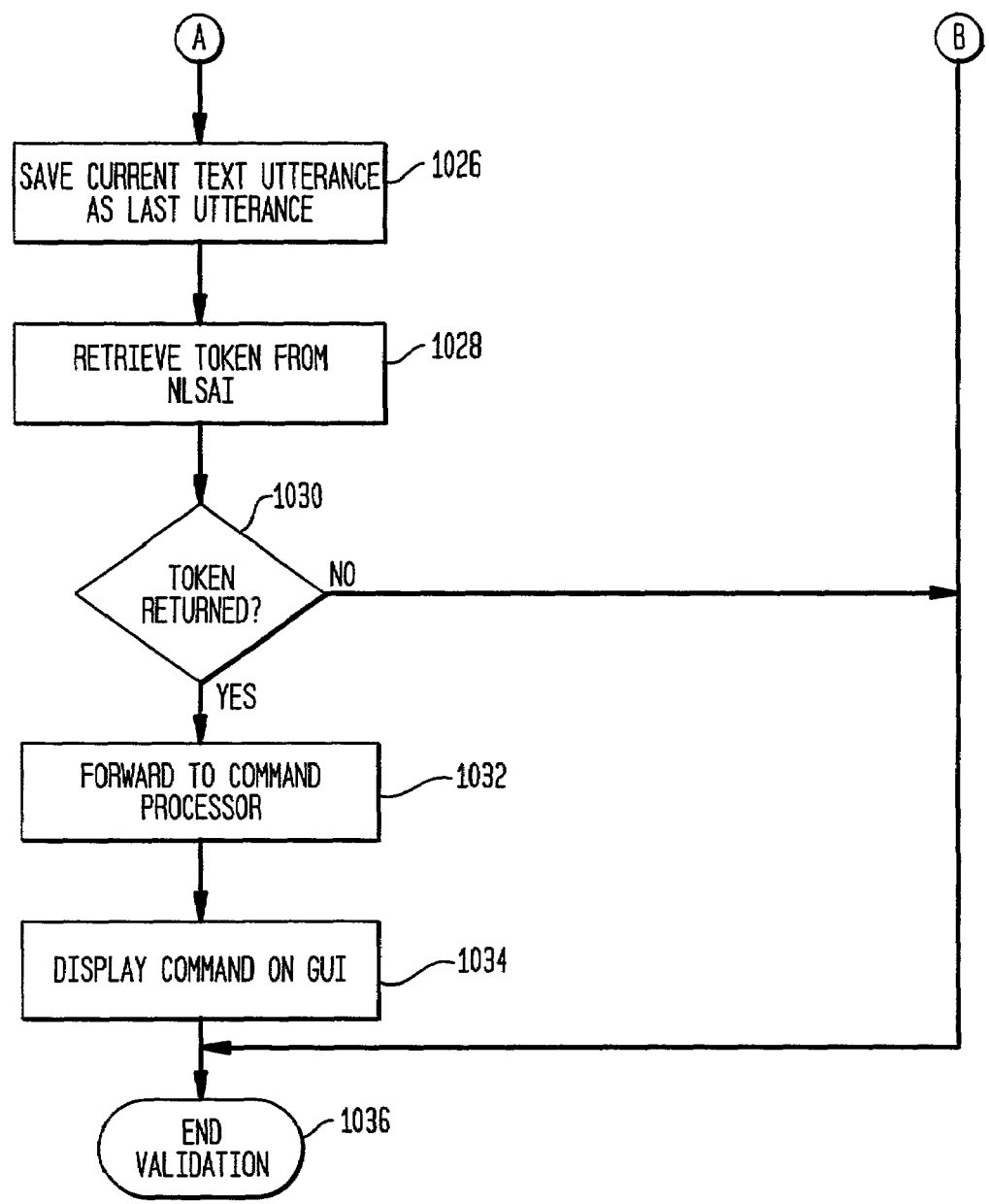

FIGS. 10A and 10B are a flowchart of processes performed by one embodiment of validator 702. Validation process 1000 begins at begin block 1002 after which in awaits receipt of a callback from ASR engine 204 at block 1004. If a callback is received, processing then advances to block 1006 at which the text utterance 211 is retrieved from ASR engine 204.

Text utterance 211 is then processed at block 1008 to determine whether the utterance was "stop listening." If so, then the voice control process is suspended at block 1010 and a display message indicating such is displayed at block 1012. Otherwise, the text utterance 211 is processed to determine whether the utterance is "Start Listening." If so, then the voice control process is invoked at block 1016 and a display message indicating such invocation is displayed at block 1018.

If the utterance is neither a start or stop listening command, then processing continues at block 1020 at which the text utterance is processed to determine wether the utterance is a repeat command. If so, then the previous command utterance is used here as the current utterance and processing continues. Otherwise, the retrieved text utterance 211 is used as the current utterance at block 1024. The current utterance is then saved as the last utterance at block 1026.

At block 1028, the token associated with the current text utterance 217 is retrieved from NLSAI 206. If there is no token, as determined at block 1030, then processing ceases at end block 1036 indicating that this command is not appropriate for oscilloscope 100. Otherwise, a token is returned and processing continues at block 1032 at which the token is forwarded to command process controller 704. The text utterances is forwarded for display at block 1034 to provide the operator with visual feedback of the utterance. Processing then ceases at block 1036.

(2) Command Processors 706

Referring again to FIG. 7, in this embodiment of speech operations module 502, the received commands are each processed by a command processor 706 specifically configured for the type of command utterance 217 and associated token 219. These same command processors 706 generate specific commands to oscilloscope subsystem 154 to invoke functions in oscilloscope subsystem 154 in response to command utterance 211. Command processors 706 may be called directly by command processor controller 704 or may be called by other command processors 706 to perform certain subsidiary operations in support of the calling command processor 706.

The command processors 706 implemented in one embodiment of speech operations module 502 are summarized in table 800 illustrated in FIGS. 8A and 8B. Each command processor 706 is referred to specifically by an 800 series reference numeral depicted to the right of the row in which the command processor is located. A brief description of the operations that oscilloscope subsystem 154 or other part of system 100 performs in response to the system command 213 generated by the identified 30 command processor 706 is illustrated in the right-hand column of table 800. The invocation of any one of the command processors 706 will cause oscilloscope subsystem 154 to perform in a manner identical to when the same command is generated using the pointing device 110 and graphical user interface 116, or front panel keyboard 108.

To facilitate understanding, the command processors 706 are partitioned by related functionally. In this illustrative embodiment, six general categories or groups of command processors 706 are provided. They include a generic group 850, a horizontal control group 852, a delayed box (magnification window) control group 854, a trigger control group 856, a channel control group 858, and an external trigger control group 860. It should be understood that any number and combination of command processors 706 may be implemented in speech operations module 502.

Generic group 850 includes command processors 801–813. These command processors process tokens 219 representing command utterances 217 related to the general operation and control of oscilloscope subsystem 154. They include a Run command processor 802; a Stop command processor 803; a Clear command processor 804; a Default Set-Up command processor 805; an Autoscale command processor 806; a Zoom command processor 807; an Expletives command processor 808; a Thank You command processor 809; a Help command processor 810; a Quick Measure Control command processor 811; a Save Screen command processor 812; and a Save Waveform command processor 813.

Horizontal control group 852 includes command processors 814–817. These command processors process tokens 219 representing command utterances 217 related to the horizontal scale and offset of the displayed waveforms. Command processor group 852 includes a Horizontal Delay Relative command processor 814; a Horizontal Delay Absolute command processor 815; a Horizontal Scale Relative command processor 816; and a Horizontal Scale Absolute command processor 817.

Delayed box (magnification window) control group 854 includes command processors 818–822. These command processors process tokens 219 representing command utterances 217 related to the control of the delayed window. Command processor group 854 includes a Delayed Sweep Control command processor 818; a Delay Box Position Relative command processor 819; a Delay Box Position Absolute command processor 820; a Delay Box Size Relative command processor 821; and a Delay Box Size Absolute command processor 822.

Trigger control group 856 includes command processors 823–829. These command processors process tokens 219 representing command utterances 217 related to triggers. Command processor group 856 includes a Trigger Mode command processor 823; a Trigger Source command processor 824; a Trigger Slope command processor 825; a Trigger Sweep command processor 826; a Trigger Coupling command processor 827; a Trigger Level Relative command processor 828; and a Trigger Level Absolute command processor 829.

Channel control group 858 includes command processors 830–837. These command processors process tokens 219 representing command utterances 217 related to channel offset and scale control. Command processor group 858 includes a Channel Offset Relative command processor 830; a Channel Offset Absolute command processor 831; a Channel Scale Relative command processor 832; a Channel Scale Absolute command processor 833; a Channel Coupling command processor 834; a Channel Impedance command processor 835; a Channel Control command processor 836; and a Channel Quick Measure command processor 837.

External trigger control group 860 includes command processors 837–841. These command processors process tokens 219 representing command utterances 217 related to external triggers. Command processor group 860 includes an External Trigger Range command processor 838; an External Trigger Coupling command processor 839; an External Trigger Impedance command processor 840; and an External Trigger Control command processor 841.

(3)Command Map 714

FIGS. 9A–9C depict a table 900 of one embodiment of command map 714. Command map 714 includes a list of tokens 219 and a pointer 930A to an associated command processor 706. In the table illustrated in FIGS. 9A–9C, command processor names are provided in a column to the right of pointer 93 OA to facilitate presentation of command map 714, although the names are provided for illustrative purposes only, and are not included in command map 714.

Command map 714 includes generally a listing of all tokens 219 that can be provided by NLSAI 206 and an associated pointer or address of a command processor 706 that is capable of processing the associated token 219. As noted, for each token 219, command processor controller 704 accesses command map 714 to obtain the address of a command processor 706 that can process the token 219. In accordance with one embodiment of the present invention, command processors 706 are configured as individual executable routines or objects, each invoked to process one or more tokens 219. Thus, more than one token may be associated with the same command processor pointer in command map 714.

As noted, command processors 706 are configured to perform related functions and, thus, may be grouped functionally. In the embodiment illustrated in FIGS. 9A–9C, for example, there is a common voice command group 900A including tokens associated with command utterances appropriate for most if not all oscilloscopes 100. A channel 1 voice commands group 900B of tokens includes all tokens associated with processing commands for channel 1. Similarly, a channel 2 voice commands group 900C of tokens includes all tokens associated with processing commands for channel 2. A channel 3 voice commands group 900D of tokens includes all tokens associated with processing commands for channel 3. Finally, a channel 4 voice commands group 900E of tokens includes all tokens associated with processing commands for channel 4. In addition, an external trigger voice command group 900F of tokens includes all tokens associated with processing external trigger voice commands.

Command map generator 708 may generate command map 714 so as to include only those functional groups 900 that are suitable for controlling the implementing signal measurement system. For example, if the digital oscilloscope 100 is a two channel oscilloscope, then the groups 900C and 900D do not have to be included in the command map 714. Preferably, command map generator 708 changes the contents of the current command map 714 dynamically in response to system change command 516.

The syntax of each token 219 is such that command processors 706 can derive the command utterance therefrom, having to obtain only command parameters 221 from NLSAI 206. Command map 714 is best understood with reference to the voice command trees illustrated in FIGS. 12A through 28. It should be appreciated that these voice command trees indicate that short, natural language sentences may be used. Not all of the voice commands that would result in the generation of the tokens 219 illustrated in FIGS. 9A–9C are provided. However, a review of the voice command trees will reveal a substantial number of the more complicated voice commands. A particular set of examples will be described below to facilitate the association of command processors 706, command map 714 and the voice command trees.

It should be understood that command map 714 may be stored in any format or any data structure, any may be stored in any type of computer-readable memory device. It should also be understood that in alternative embodiments, NLSAI 206 is not necessary. For example, in embodiments wherein the commands are limited to one or two word commands, parsing may not be necessary. However, in embodiments such as those described herein wherein command parameters are included within natural language sentences, NLSAI 206 is preferred to extract the command parameters and to generate the corresponding token 219.

F. EXAMPLES (1) Channel Offset Relative Commands

Figure 12A:
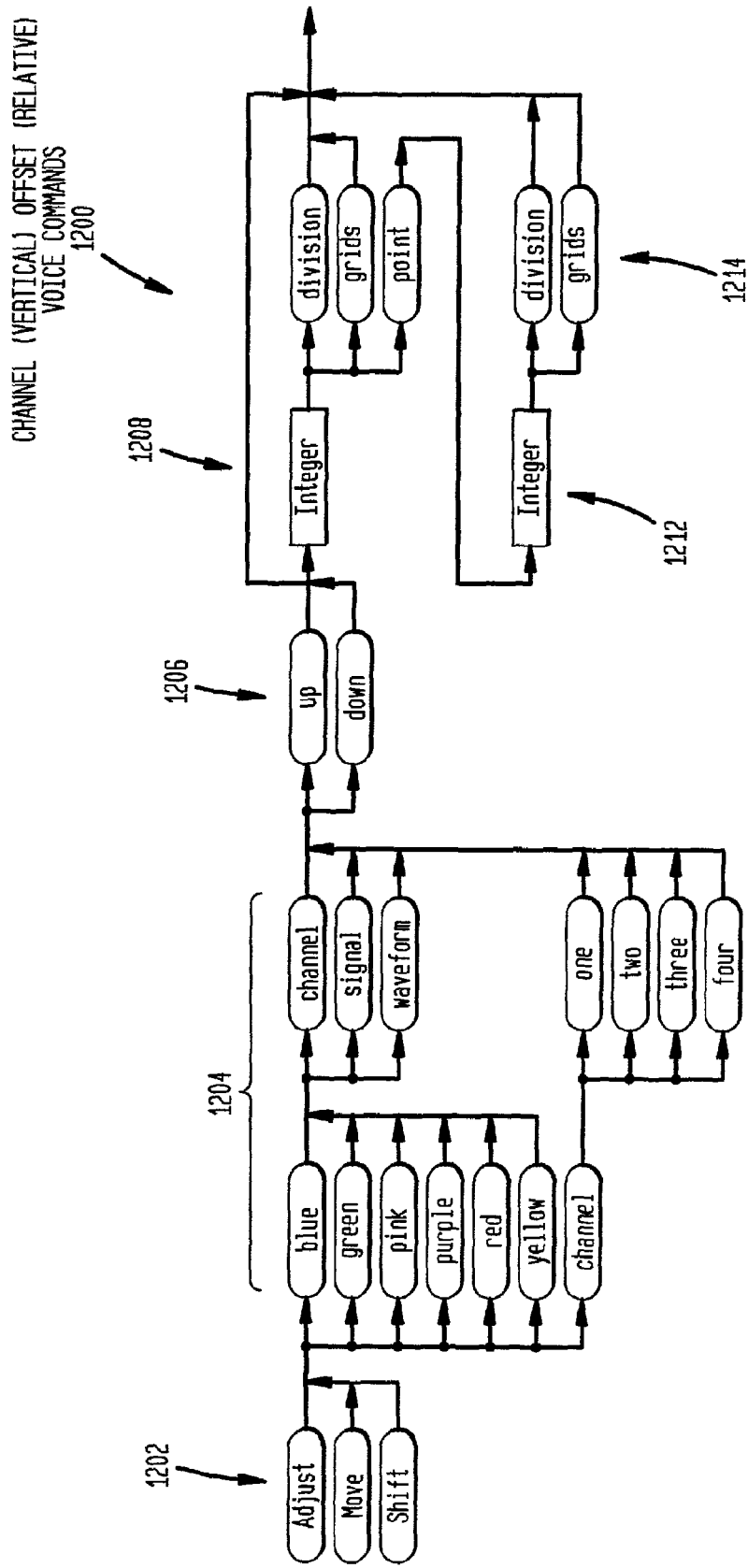
FIG. 12A is a diagram illustrating the vertical offset relative voice commands in accordance with one embodiment of the present invention.

FIG. 12A is voice command tree illustrating the voice commands that may be used to change the relative position (vertical position) of a displayed channel. Word options 1202 may be used as the first utterance, after which the desired channel is identified by word options 1204. These options include identifying the desired channel by the color in which it is displayed, as well as by channel number. The channel itself may be identified by the words 'channel," "signal," or "waveform." The next work option 1206 includes the direction in which the desired channel is to be adjusted (up or down). The final word options provides the operator with the ability to indicate the number of divisions that the desired waveform is to be adjusted. The operator may also not provide any indication of the desired adjustment distance.

NLSAI 206 generates one of the following tokens 219 in response to receiving a text utterance 217 conforming to the voice command tree 1200. If channel 1 is the designated channel, tokens "pch1offrel" or "nch1offrel" illustrated on lines 971 and 972, respectively of command map 714 would be generated, depending on whether the adjustment was up (positive) or down (negative), respectively. Similarly, if channel 2 the designated channel, tokens "pch2offrel" or "nch2offrel" illustrated on lines 984 and 985, respectively, of command map 714 would be generated. For channel 3, "pch3offrel" or "nch3offrel" illustrated on lines 997 and 998, respectively, of command map 714 would be generated. For channel 4, "pch4offrel" or "nch4offrel" illustrated on lines 911A and 912A, respectively, of command map 714 would be generated.

Figure 29:
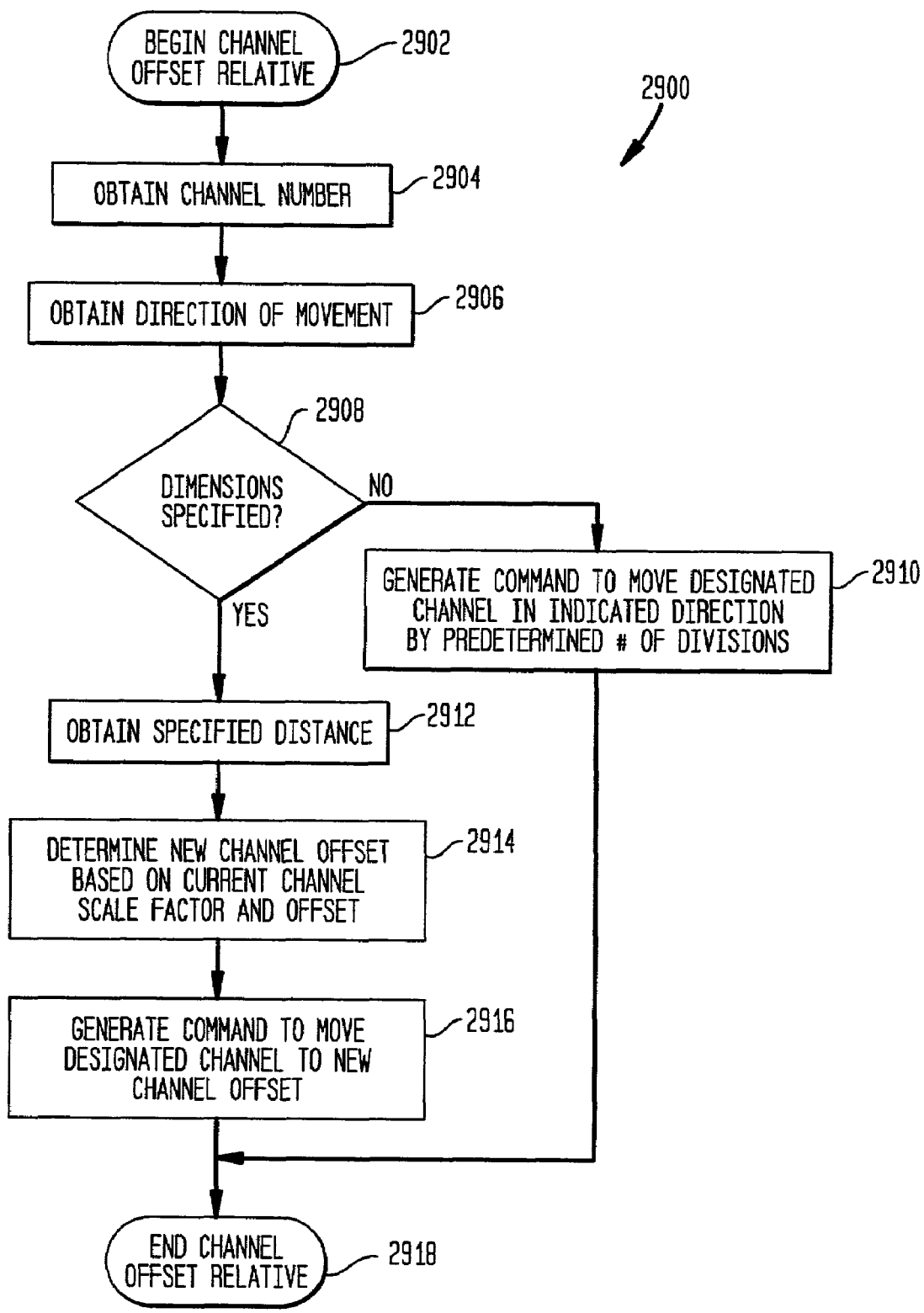
FIG. 29 is a flowchart of the processes performed by channel offset relative command processor in accordance with one embodiment of the present invention.

Referring to command map 714, all 8 of these tokens are associated with the same command processor: Channel Offset Relative 830, having a pointer chXoffrel. The processes performed by this command processor is illustrated in the flowchart shown in FIG. 29. Referring now to FIG. 29, channel offset relative processing 2900 begins at begin block 2902 upon receipt of token 219 from command processor controller 704.

The channel number in the token is obtained at block 2904. This may be achieved by parsing the token 219 to identify the fourth character in the token since all of the tokens have a similar syntax. Similar operations may be performed for obtaining the direction of movement at block 2906 since the first character identifies the direction of adjustment (p or n).

As noted, the operator may not have indicated the desired distance (divisions) that the designated channel is to be adjusted. At block 2908 such a determination is made. The number of divisions, if specified, would have been saved as a command parameter by NLSAI 206. As such, channel offset command processor would make the determination by querying NLSAI 206 for the contents of the appropriate buffer. If no value is returned, then processing continues at block 2910 at which a system command 213 is generated to move the designated channel in the indicated direction by a predetermined constant number of divisions, such as 0.1 divisions. The operator can then request that the last command be repeated, continuing to do so until the desired adjustment is achieved.

If at block 2908 it is determined that the operator specified a desired number of divisions in which to adjust the desired channel, the processing continues at block 2912 at which the specified distance is obtained from NLSAI 206 and, at block 2914, the new channel offset is determined. Here, for the new channel offset to be determined, the current channel offset and the current scale factor must be obtained from oscilloscope subsystem 154. Thus, the channel offset relative command processor 830 queries oscilloscope subsystem 154 and obtains the current data. Once the current offset (division) of the desired channel, and the scale factor (volts/division) is known, then the new channel offset can be calculated.

At block 2916 a system command 213 is generated to oscilloscope subsystem 154 instructing it to move the desired channel to the new channel offset. Processing then ceases at block 2918.

(2) Channel Offset Absolute Commands

Figure 12B:
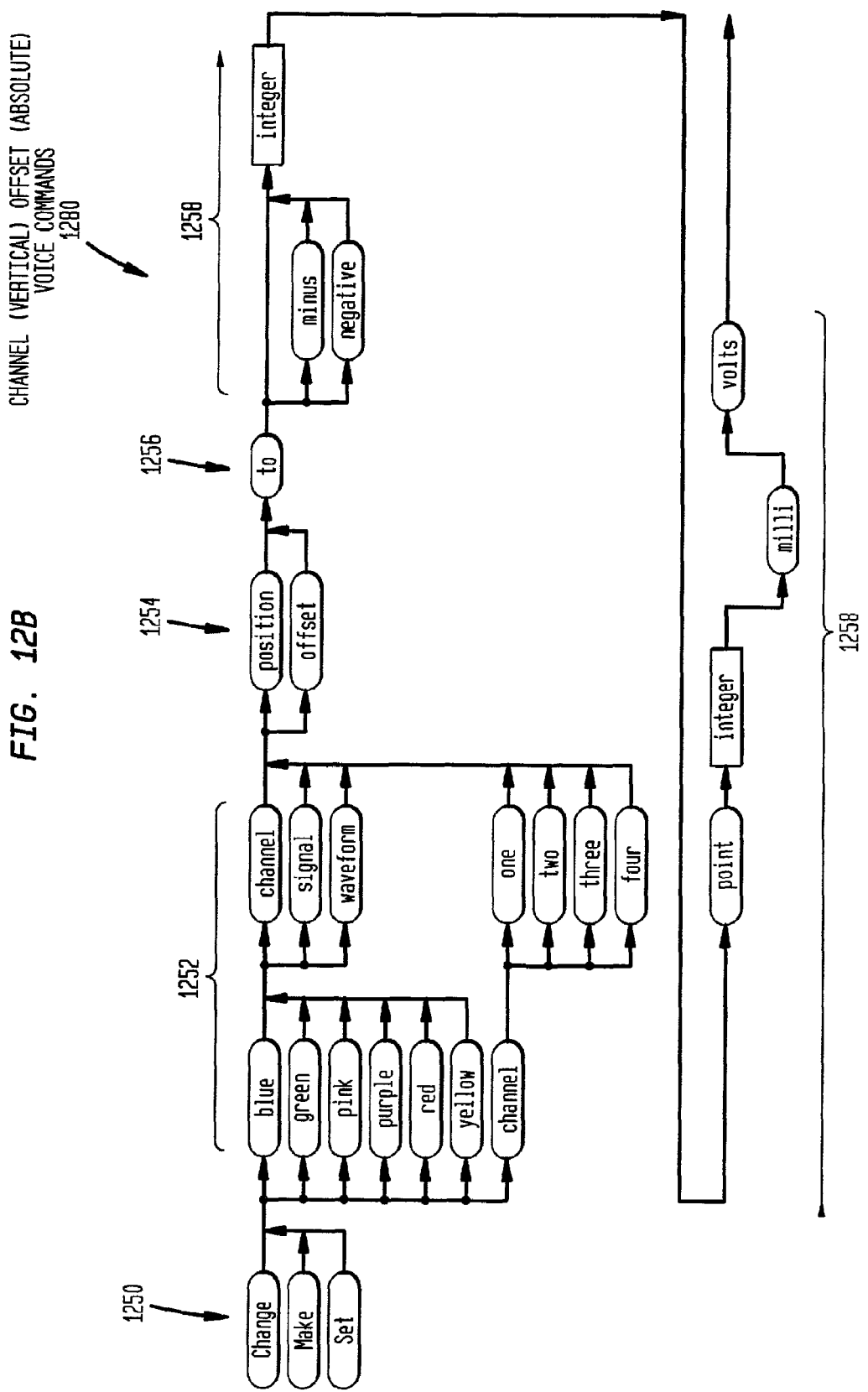
FIG. 12B is a diagram illustrating the vertical offset absolute voice commands in accordance with one embodiment of the present invention.

FIG. 12B is voice command tree illustrating the voice commands that may be used to change the absolute position (vertical position) of a displayed channel. Word options 1250 maybe used as the first utterance, including "make," "change," or "set." After this, the desired channel is identified by word options 1252. These options include identifying the desired channel by the color in which it is displayed, as well as by channel number. The channel itself may be identified by the words 'channel," "signal," or "waveform." The next 2 word options 1254 and 1256 identify this voice command as an offset absolute command with the words "offset" or "position" followed by the word "to." The final word options provides the operator with the ability to indicate the number of volts that the desired waveform is to be offset.

NLSAI 206 generates one of the following tokens 219 in response to receiving a text utterance 217 conforming to the voice command tree 1280. If channel 1 is the designated channel, tokens "pch1offabs," "pch1offabsmill," "nch1offabs" or "nch1offabsmill" illustrated on lines 975–978, respectively, of command map 714 would be generated, depending on whether the adjustment was positive or negative, and whether 20 units of millivolts was specified. Similarly, for channel 2, tokens "pch2offabs," "pch2offabsmill," "nch2offabs" or "nch2offabsmill" (command map lines 988–991); for channel 3, "pch3offabs," "pch3offabsmill," "nch3offabs" or "nch3offabsmill" (command map lines 902A–905A); and for channel 4, "pch4offabs," "pch4offabsmill," "nch4offabs" or "nch4offabsmill" (command map lines 915A–918A).

Figure 30:
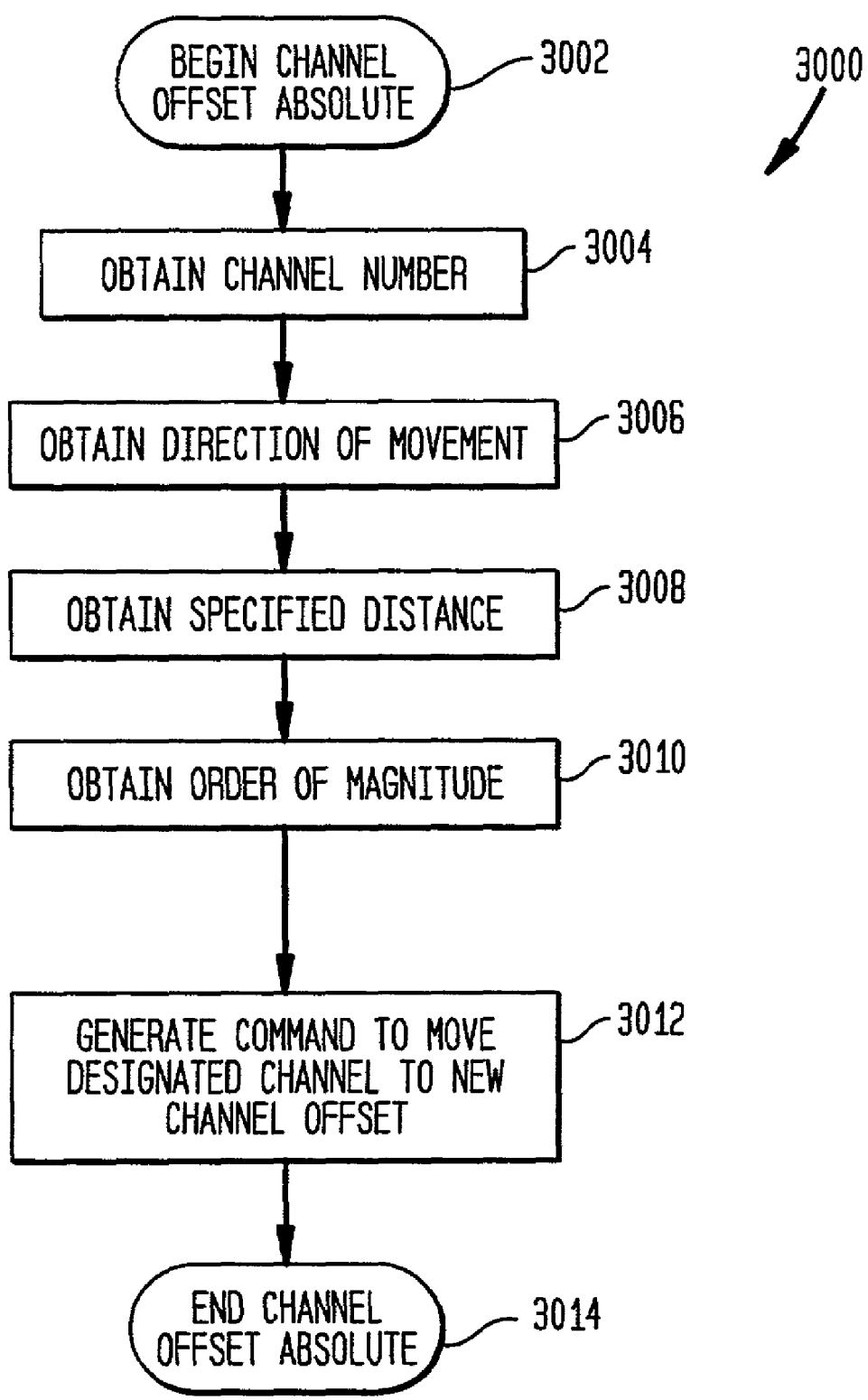
FIG. 30 is a flowchart of the processes performed by channel offset absolute command processor in accordance with one embodiment of the present invention.

Referring to command map 714, all 16 of these tokens are associated with the same command processor: Channel Offset Absolute, having a pointer chXoffabs. The processes performed by this command processor is illustrated in the flowchart shown in FIG. 30. Referring now to FIG. 30, channel offset absolute processing 3000 begins at begin block 3002 upon receipt of token 219 from command processor controller 704.

The channel number in the token is obtained at block 3004. This may be achieved by parsing the token 219 to identify the fourth character in the token since all of the tokens have a similar syntax. Similar operations may be performed for obtaining whether the position is to be positive or negative at block 3006 since the first character identifies the direction of adjustment (p or n).

At block 3008 the number of divisions channel offset absolute command processor 706 queries NLSAI 206 for the contents of the appropriate buffer containing the command parameter of number of specified divisions. At block 3010 the order of magnitude is obtained from the token 219. As shown above, when the operator specifies the integer, either no units (volts) or millivolts may be designated. At block 3010, the suffix of the token 219 is parsed and examined to determine the order of magnitude.

At block 3012, a system command 213 is generated to oscilloscope subsystem 154 instructing it to move the desired channel to the new channel offset. Processing then ceases at block 3014.

(3) Channel (Vertical) Scale Relative Commands

Figure 13A:
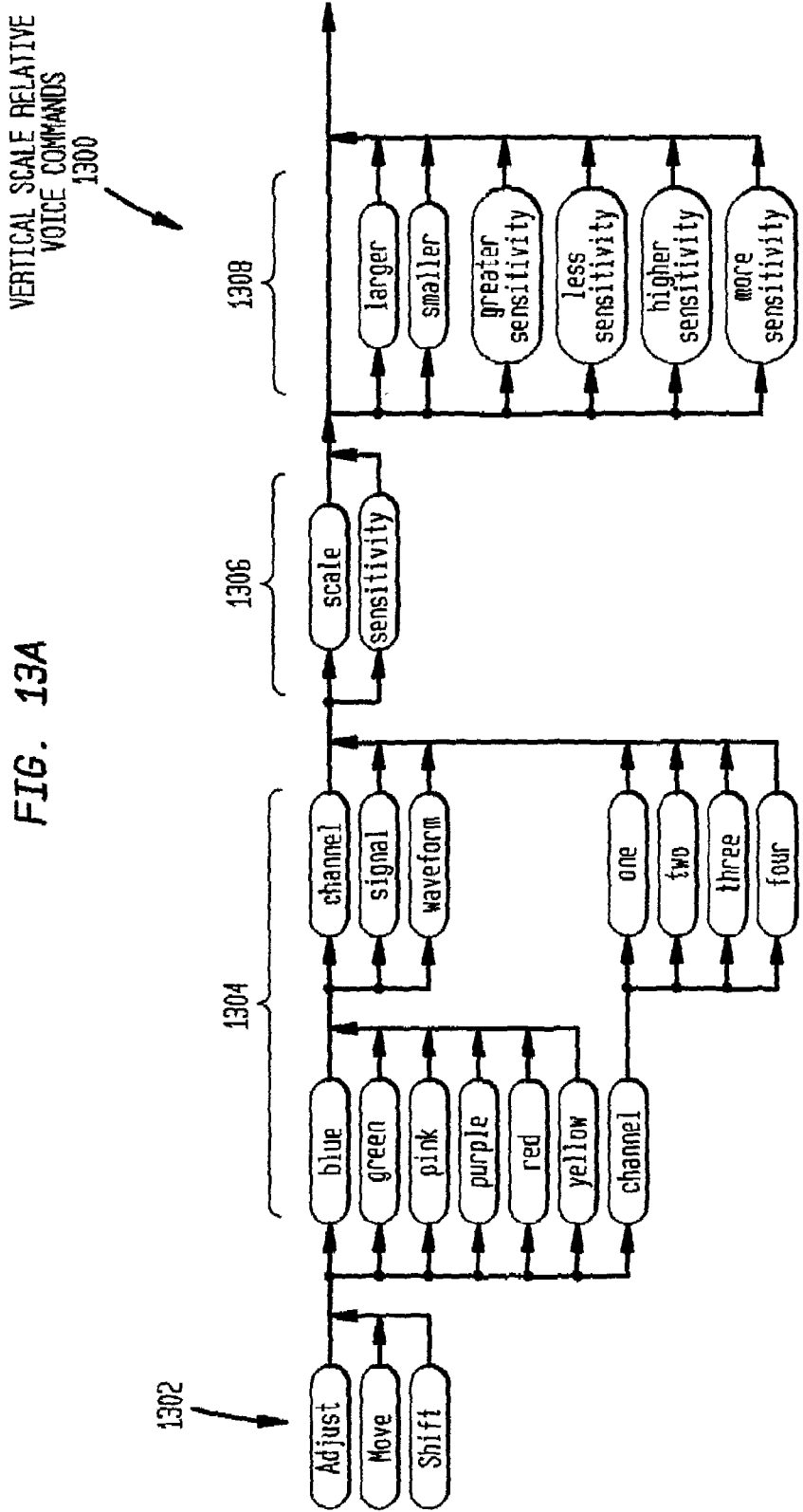
FIG. 13A is a diagram illustrating the vertical scale relative voice commands in accordance with one embodiment of the present invention.
Figure 13B:
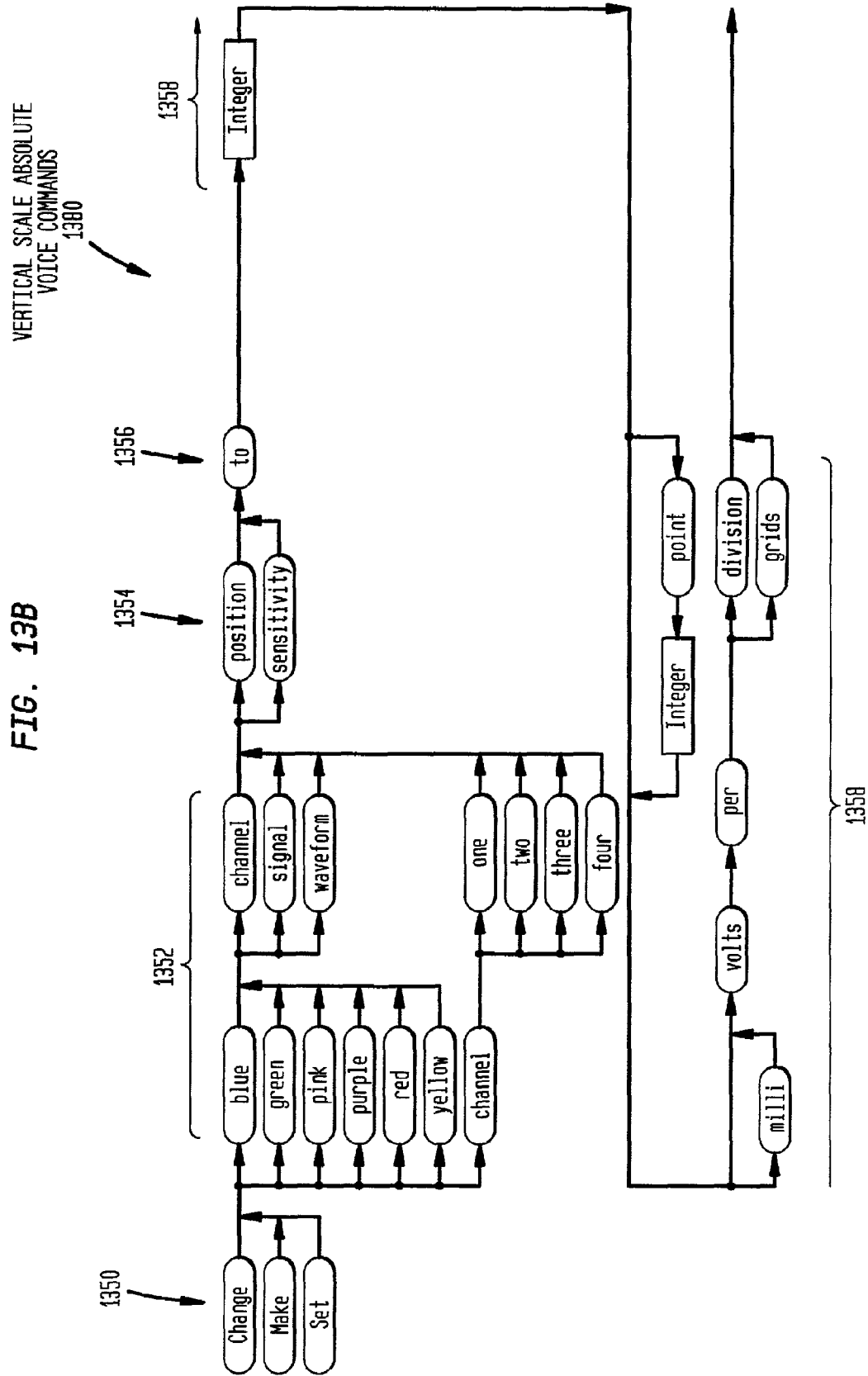
FIG. 13B is a diagram illustrating the vertical scale absolute voice commands in accordance with one embodiment of the present invention.
Figure 14A:
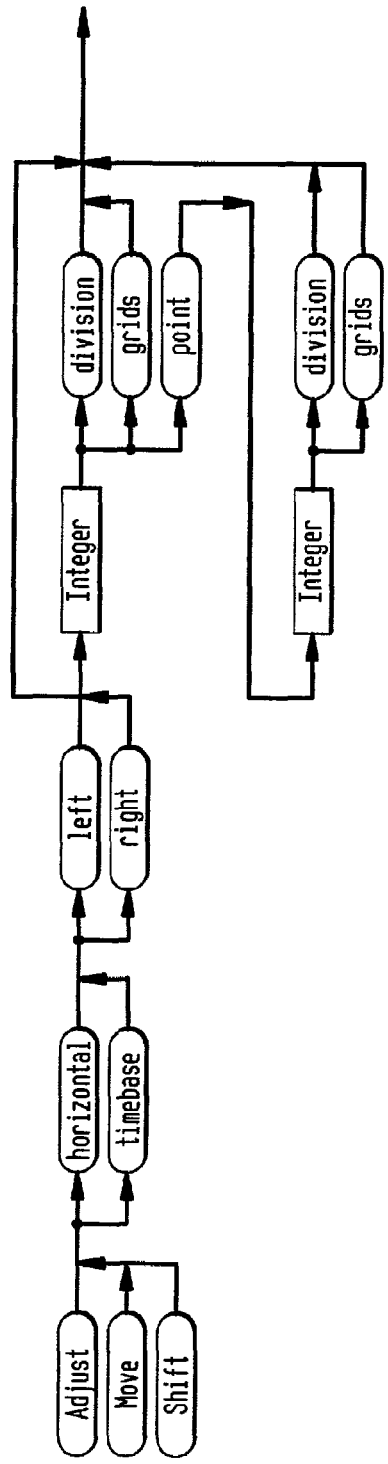
FIG. 14A is a diagram illustrating the horizontal position relative voice commands in accordance with one embodiment of the present invention.
Figure 14B:
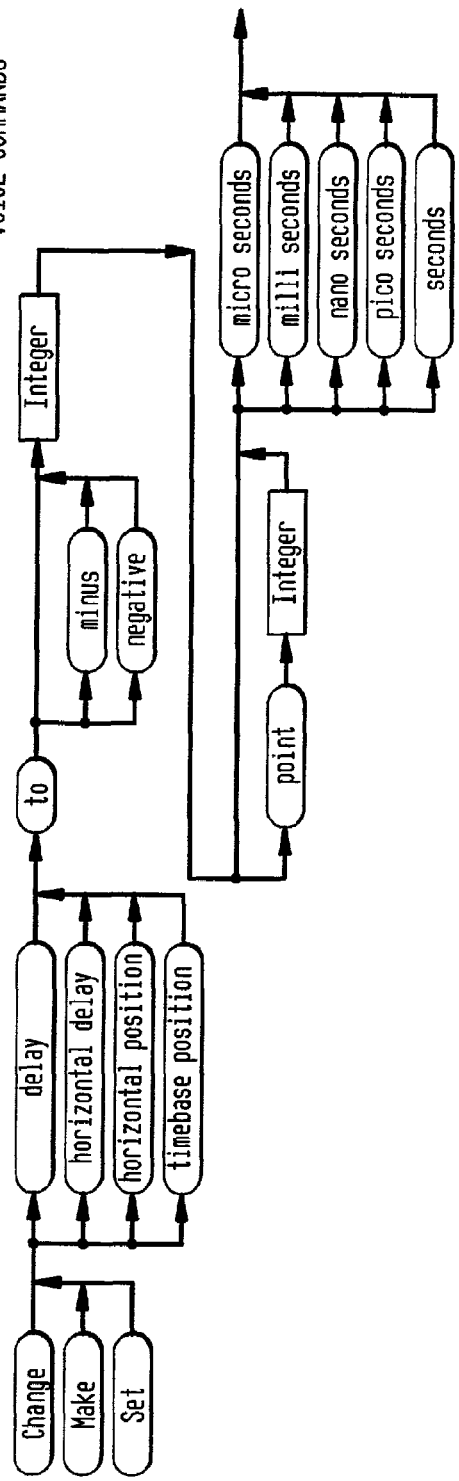
FIG. 14B is a diagram illustrating the horizontal position absolute voice commands in accordance with one embodiment of the present invention.
Figure 15:
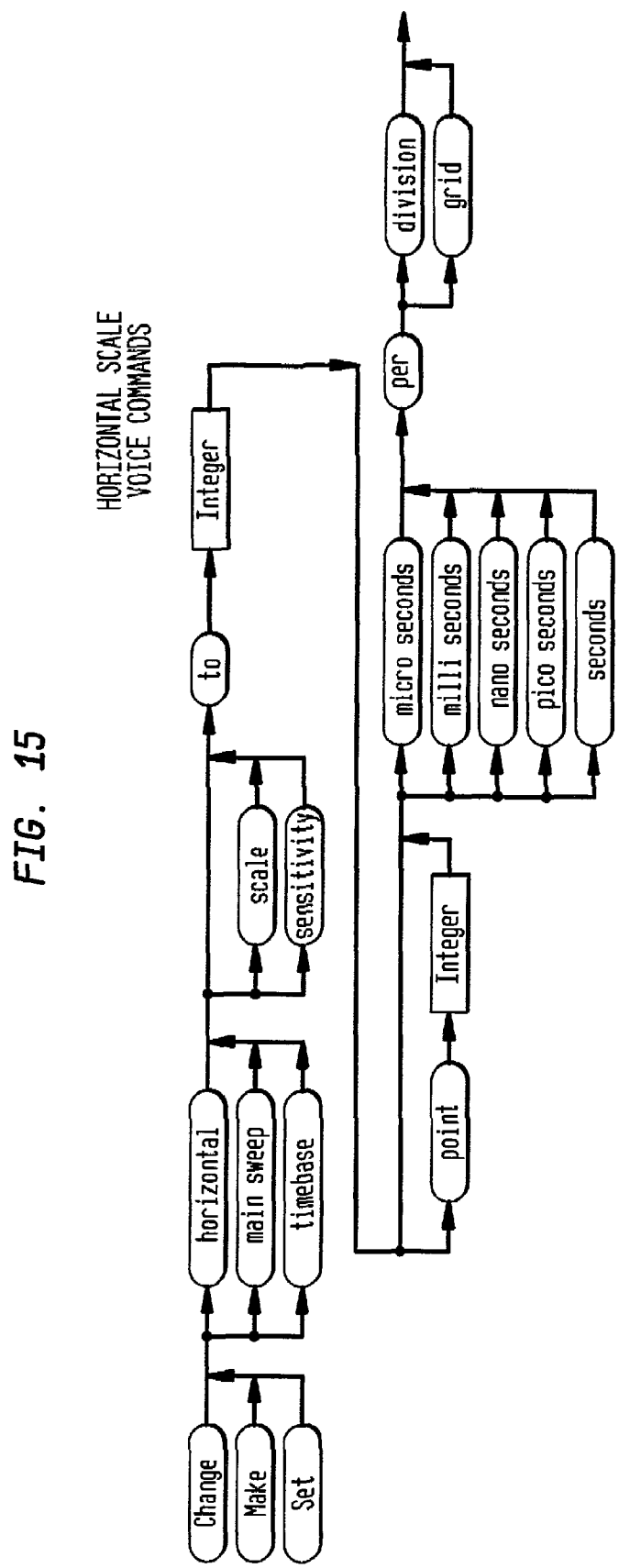
FIG. 15 is a diagram illustrating the horizontal scale absolute voice commands in accordance with one embodiment of the present invention.
Figure 16:
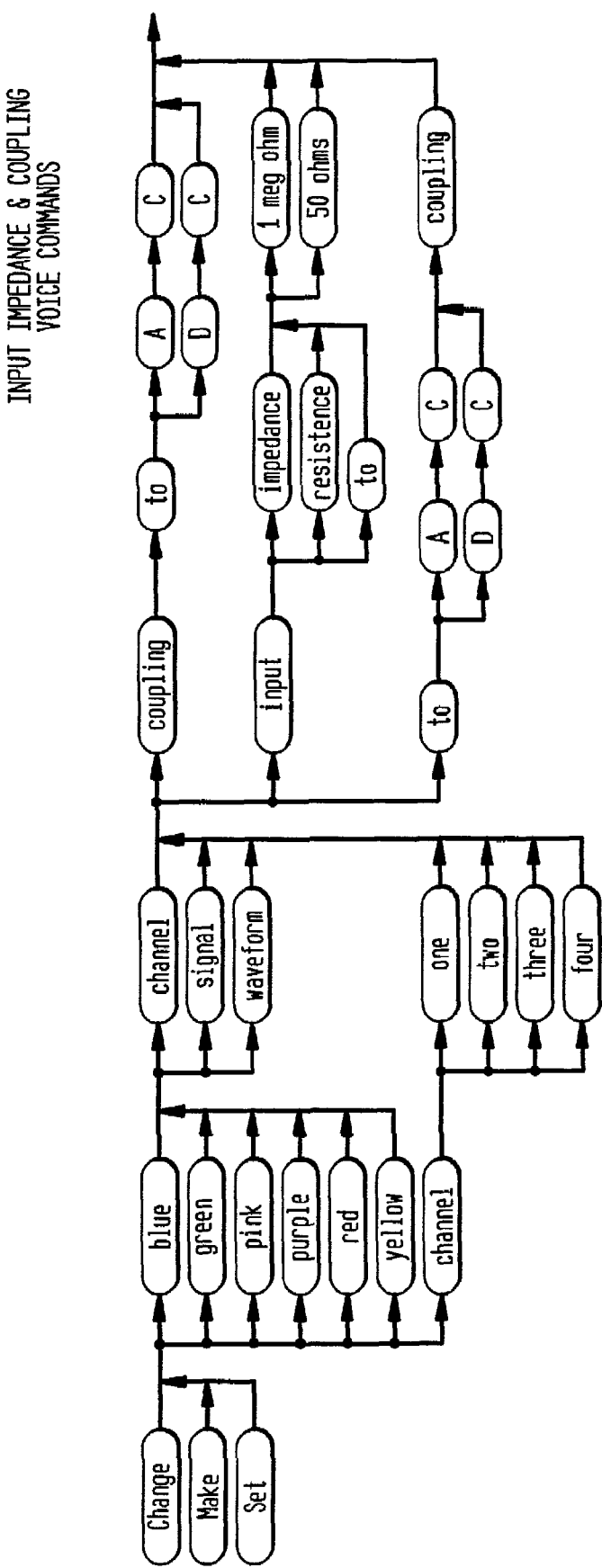
FIG. 16 is a diagram illustrating the input impedance and coupling voice commands in accordance with one embodiment of the present invention.
Figure 17:
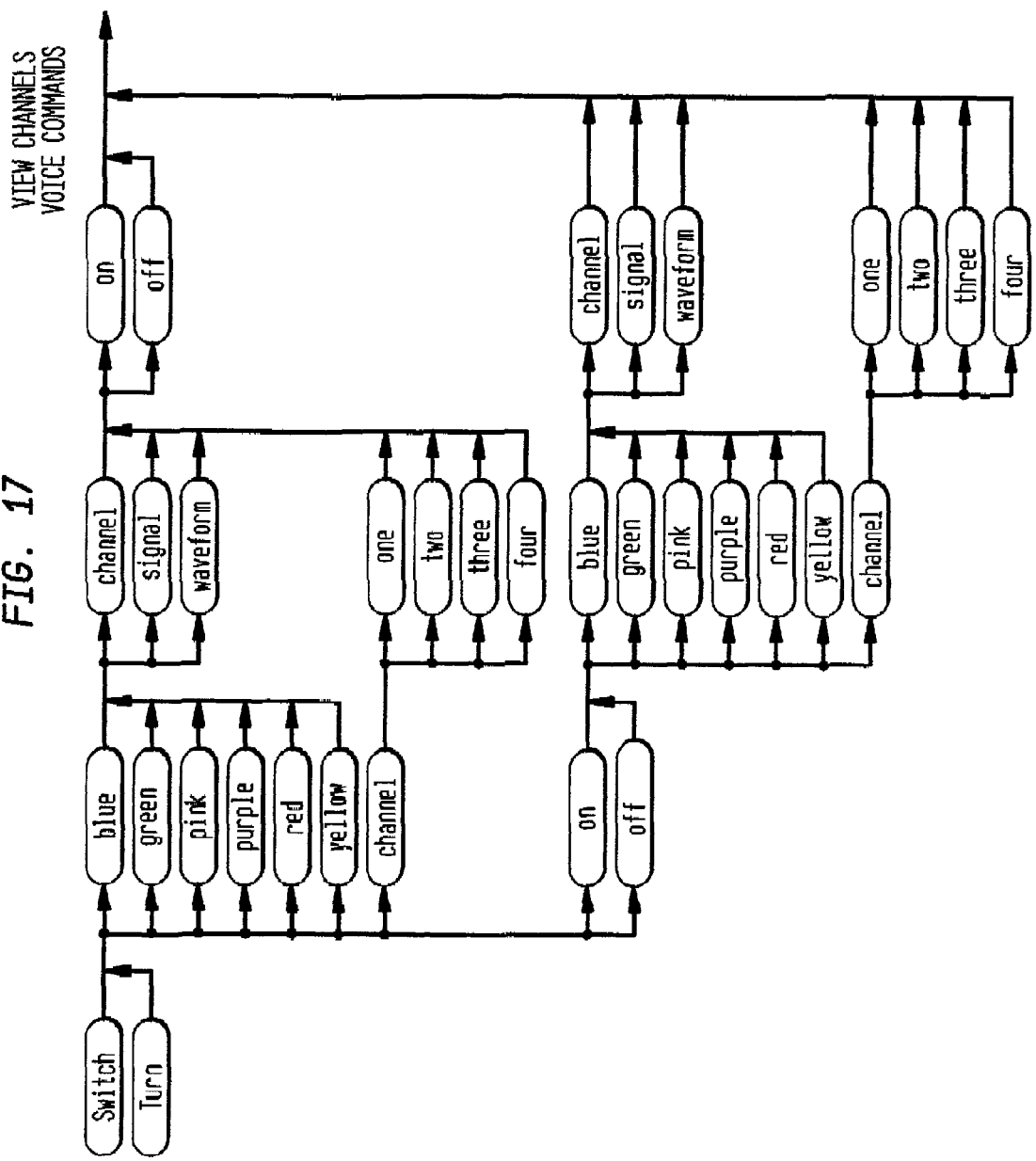
FIG. 17 is a diagram illustrating the view channels voice commands in accordance with one embodiment of the present invention.
Figure 18A:
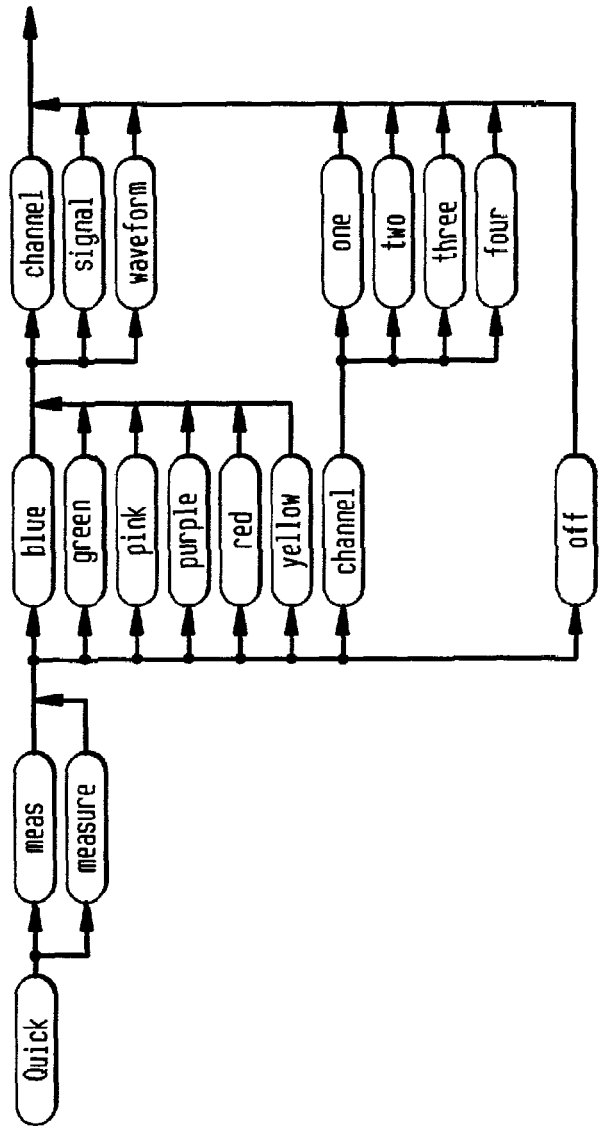
FIG. 18A is a diagram illustrating the quick measure assignment voice commands in accordance with one embodiment of the present invention.
Figure 18B:
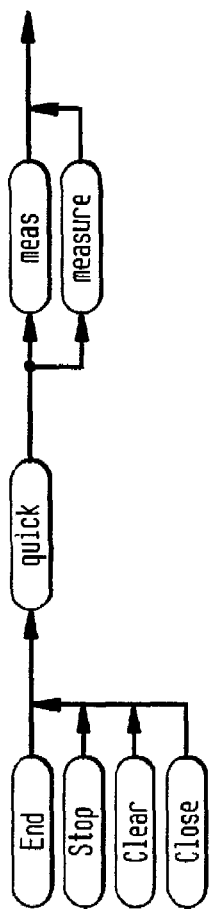
FIG. 18B is a diagram illustrating the quick measure control voice commands in accordance with one embodiment of the present invention.
Figures 19A, 19B:
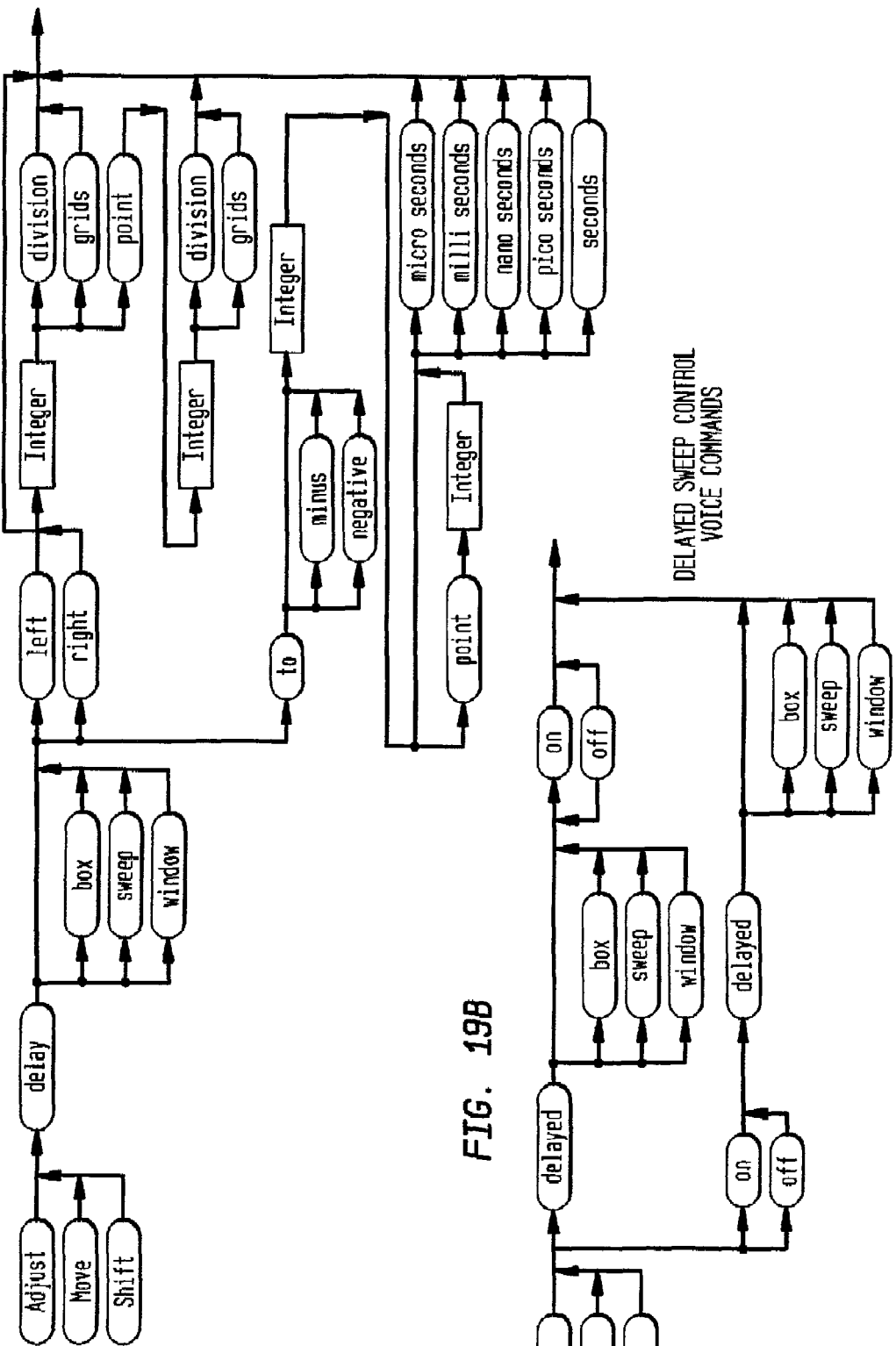
FIG. 19A is a diagram illustrating the delayed sweep (relative and absolute) voice commands in accordance with one embodiment of the present invention.
FIG. 19B is a diagram illustrating the delayed sweep control voice commands in accordance with one embodiment of the present invention.
Figure 20A:
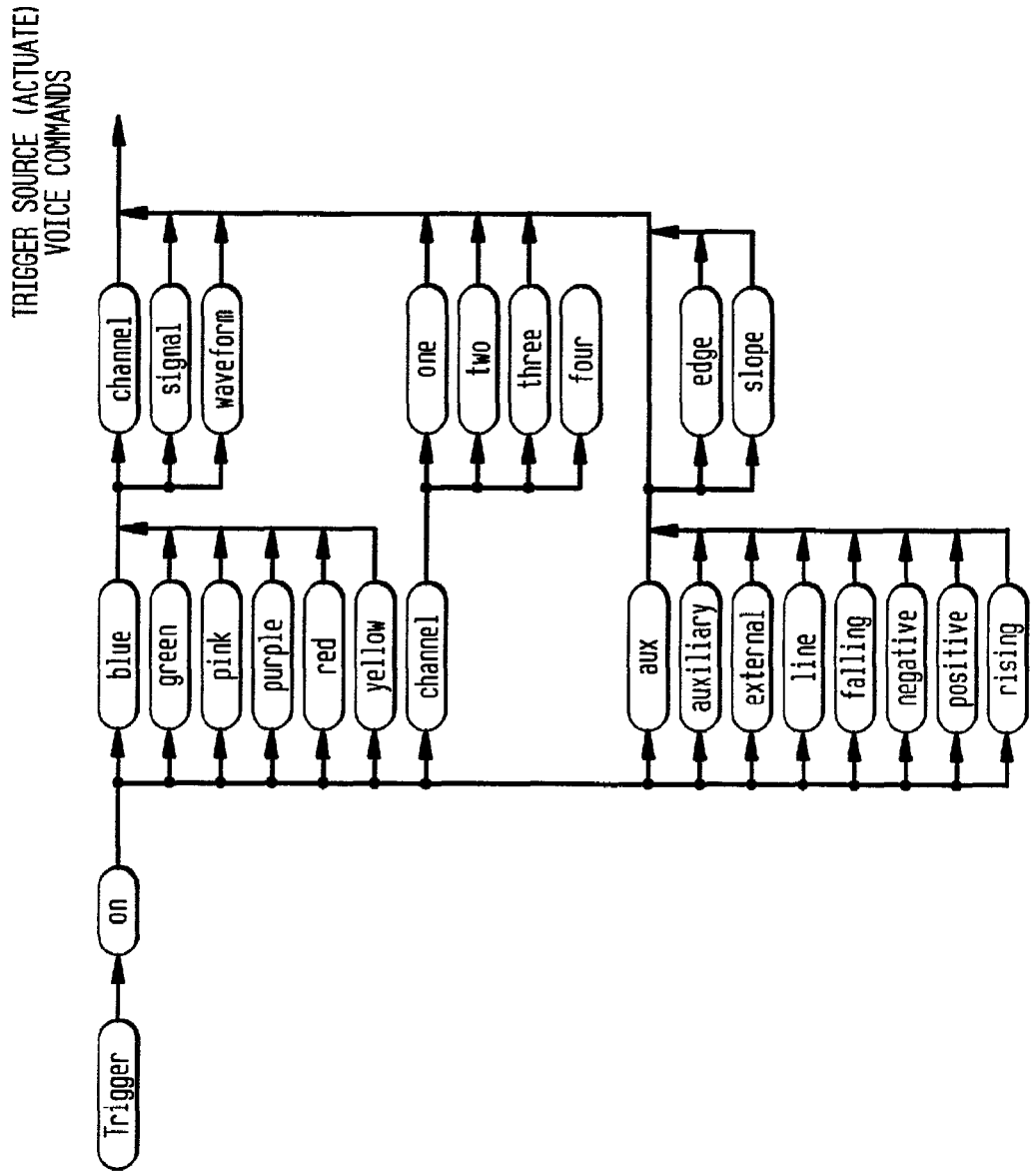
FIG. 20A is a diagram illustrating trigger source activate voice commands in accordance with one embodiment of the present invention.
Figure 20B:
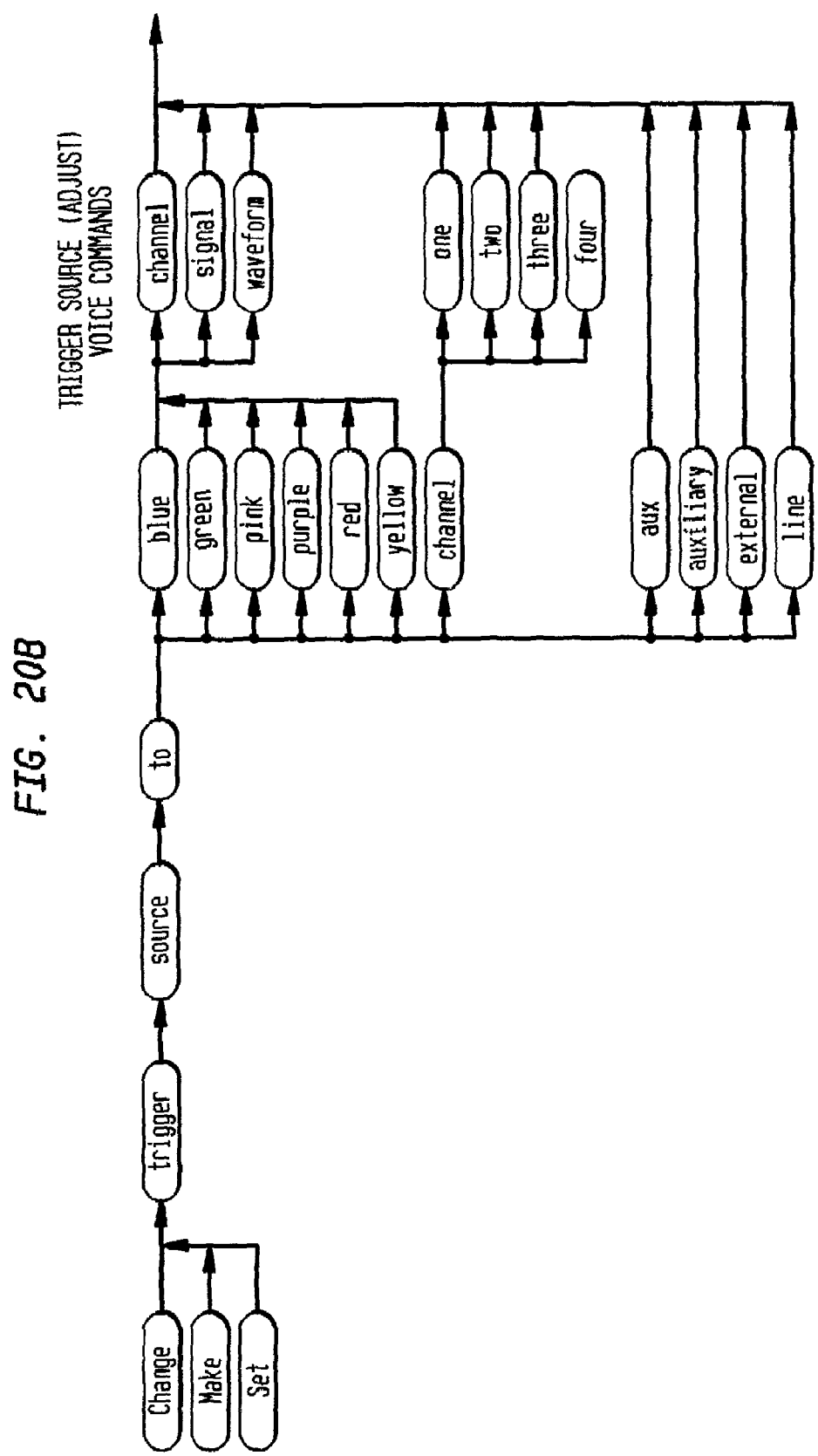
FIG. 20B is a diagram illustrating trigger source adjust voice commands in accordance with one embodiment of the present invention.
Figure 21:
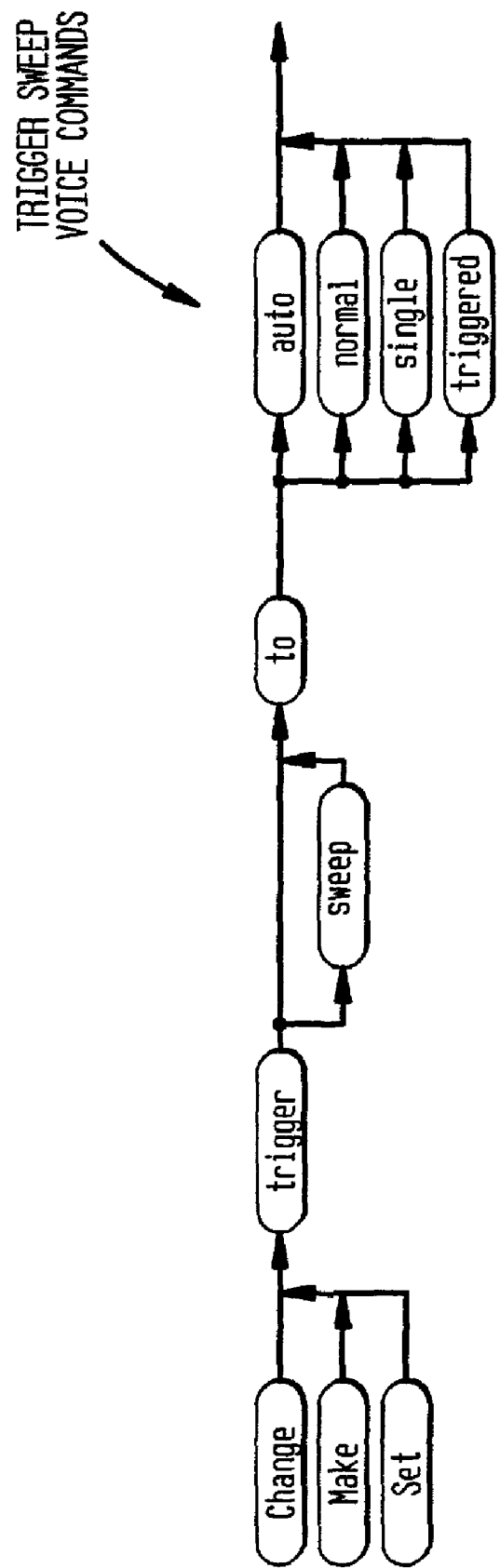
FIG. 21 is a diagram illustrating trigger sweep voice commands in accordance with one embodiment of the present invention.
Figure 22:
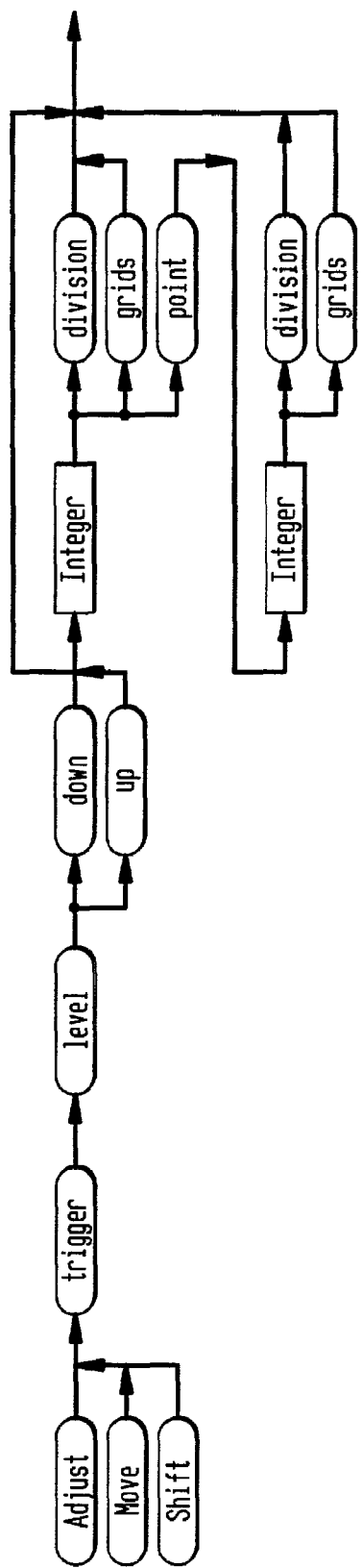
FIG. 22 is a diagram illustrating trigger level relative voice commands in accordance with one embodiment of the present invention.
Figure 23:
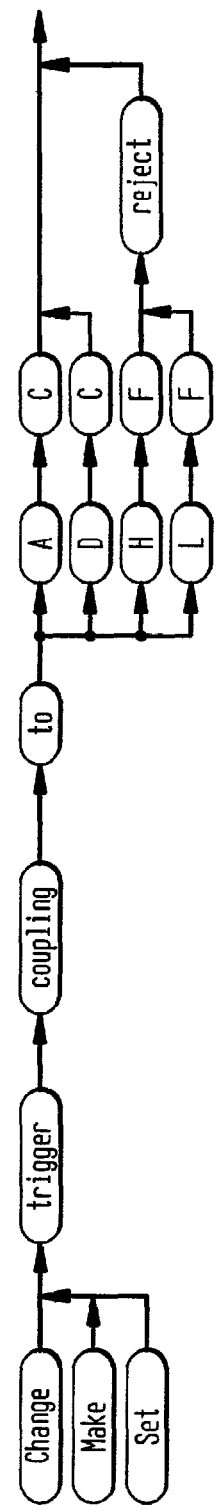
FIG. 23 is a diagram illustrating trigger coupling voice commands in accordance with one embodiment of the present invention.
Figure 24:
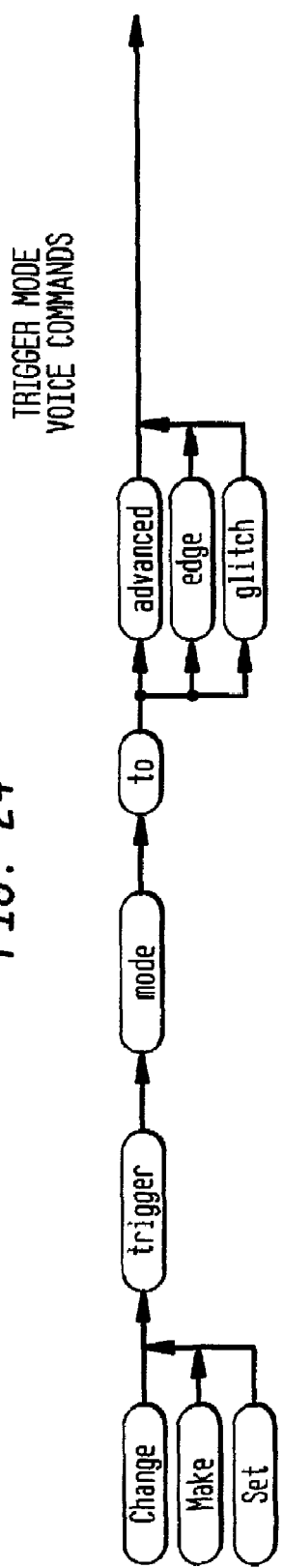
FIG. 24 is a diagram illustrating trigger mode voice commands in accordance with one embodiment of the present invention.
Figure 25:
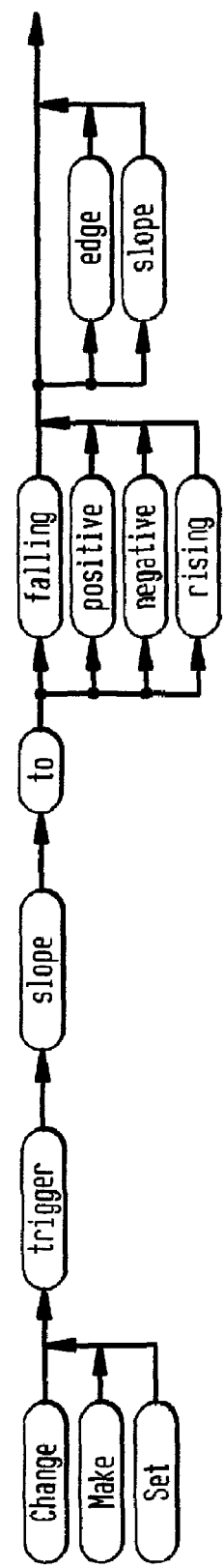
FIG. 25 is a diagram illustrating trigger slope voice commands in accordance with one embodiment of the present invention.
Figure 26:
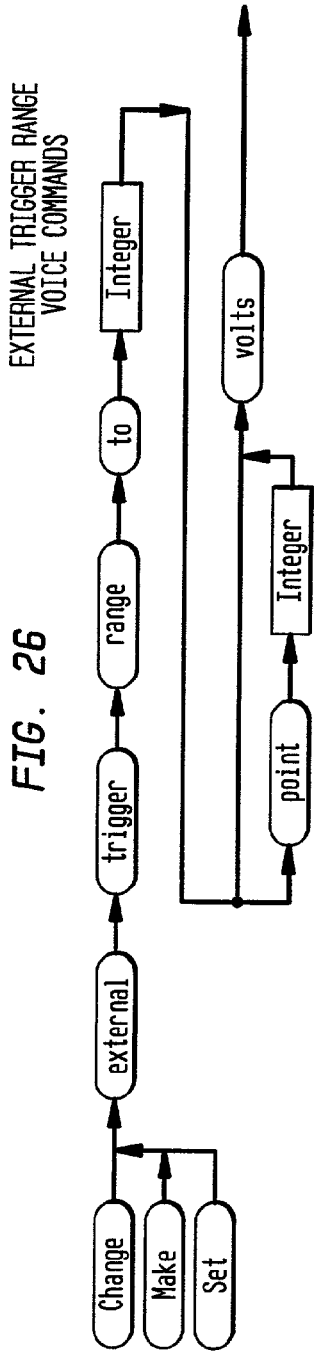
FIG. 26 is a diagram illustrating external trigger range voice commands in accordance with one embodiment of the present invention.
Figure 27:
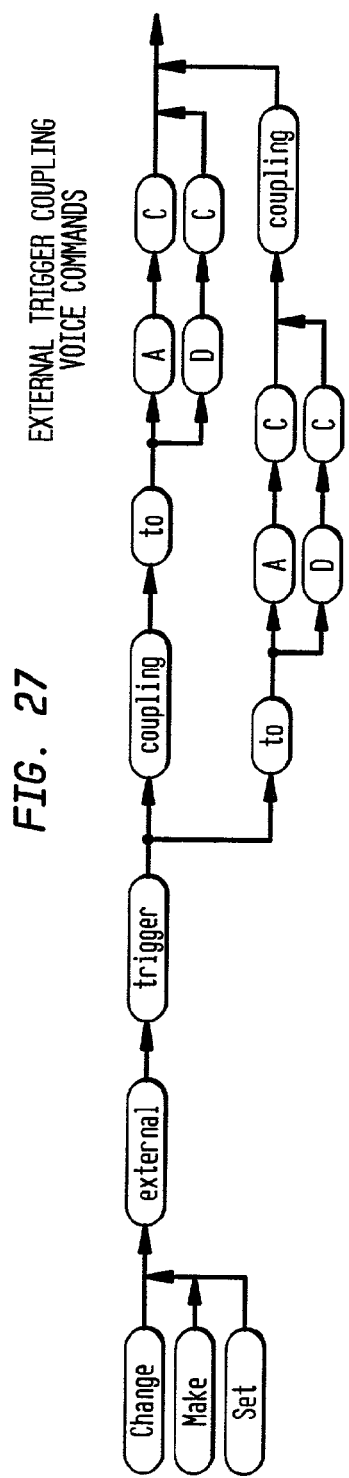
FIG. 27 is a diagram illustrating external trigger coupling voice commands in accordance with one embodiment of the present invention.
Figure 28:
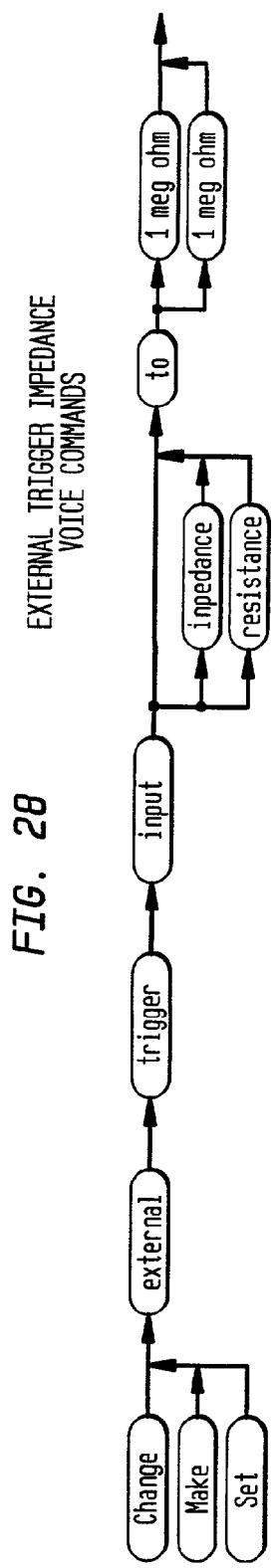
FIG. 28 is a diagram illustrating external trigger impedance voice commands in accordance with one embodiment of the present invention.

FIG. 13A is voice command tree illustrating the voice commands that may be used to change the relative scale (vertical scale) of a displayed channel. Word options 1302 may be used as the first utterance, including "adjust," "move," or "shift." After this, the desired channel is identified by word options 1304. These options include identifying the desired channel by the color in which it is displayed, as well as by channel number. As above, the channel itself may be identified by the words 'channel," "signal," or "waveform." The next word option 1306 identifies that the scale (or sensitivity) of the designated channel is the subject of the voice command. The final word options provides the operator with the ability to indicate qualitatively the desired adjustment with such words as "larger," "smaller," "greater sensitivity," and the like.

NLSAI 206 generates one of the following tokens 219 in response to receiving a text utterance 217 conforming to the voice command tree 1300. If channel 1 is the designated channel, token "ch1scalerel" illustrated on line 979 of command map 714 would be generated. Similarly, for channel 2, token "ch2scalerel" (command map line 992); for channel 3, "ch3scalerel" (command map line 906A); and for channel 4, "ch4scalerel" (command map line 919A).

Figure 31:
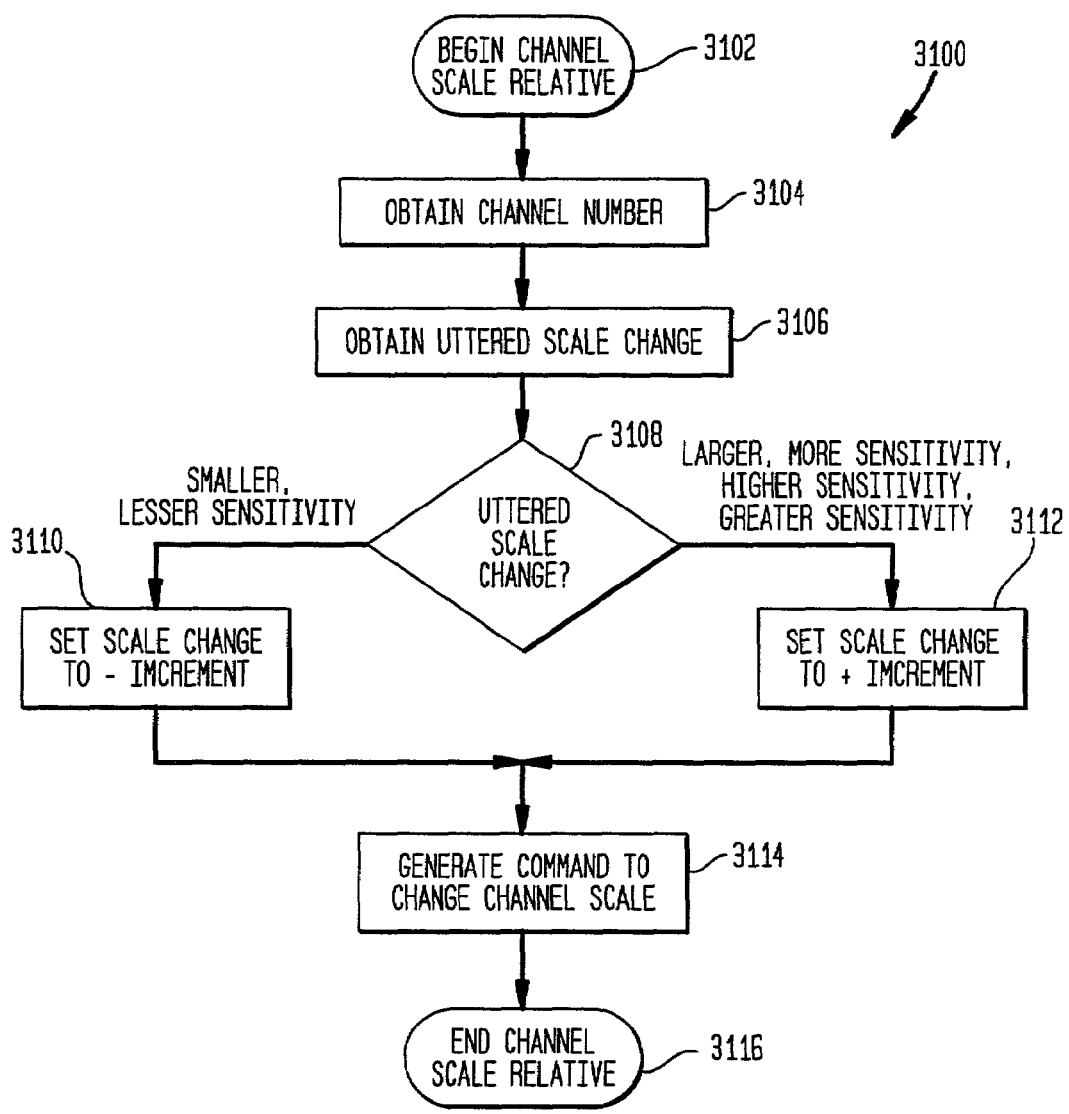
FIG. 31 is a flowchart of the processes performed by channel scale relative command processor in accordance with one embodiment of the present invention.

Referring to command map 714, all 4 of these tokens are associated with the same command processor: Channel Scale Relative 832, having a pointer chXscalerel. The processes performed by this command processor 832 is illustrated in the flowchart shown in FIG. 31. Referring now to FIG. 31, channel scale relative processing 3100 begins at begin block 3102 upon receipt of token 219 from command processor controller 704.

The channel number in the token is obtained at block 3104. This may be achieved by parsing the token 219 to identify the third character in the token since all of the tokens have a similar syntax. At block 3106 the uttered scale change is obtained from NLSAI 206 as a command parameter 221. The command parameter 221 is analyzed at block 3108.

If the command parameter is "smaller" or "lesser sensitivity," then the scale change is set to a negative predetermined constant value, referred to as –increment. If the command parameter is "larger," "more sensitivity," "higher sensitivity," or "greater sensitivity," then the scale change se set to a + increment at block 3112.

At block 3114 a system command 213 is generated to oscilloscope subsystem 154 instructing it to adjust the scale of the designated channel by a predetermined constant amount. Processing then ceases at block 3116.

While various embodiments of the present invention have been described above, it should be understood that they have been presented by way of example only, and not limitation. For example, the above-noted digital oscilloscope includes a standard PC based computer system incorporated therein. Accordingly, the present invention, when implemented in such a system, utilizes commonly available software programs where possible and appropriate to implement the above-noted operations. However, it should be understood that the present invention is not limited to implementation in such an environment. For instance, in an alternative embodiment wherein the present invention is implemented in other signal measurement systems that do not have such a PC platform, the present invention is implemented in firmware and dedicated hardware. It should also be understood that the present invention may be implemented in any combination of hardware, firmware or software to provide the above functionality in the desired application. All such alternative implementations are considered to be apparent to those of ordinary skill in the art. Thus, the breadth and the scope of the present invention are not limited by any of the above exemplary embodiments, but are defined only in accordance with the following claims and their equivalents.

The invention claimed is:

1. A speech-responsive command and control system for enabling an operator to control an oscilloscope using voice commands, the control system-comprising:
   a speech recognition engine that determines whether a digitized speech signal representing a received utterance is a valid command; and
   a measurement system controller that selects at least one of a plurality of command processors corresponding to the valid command, and controls the oscilloscope using the selected command processor to implement the valid command, wherein the command processors include at least one command processor related to a scale of a waveform displayed by the oscilloscope, at least one command processor related an offset of the displayed waveform, and at least one command processor related to a trigger.

2. The system of claim 1,
   wherein the speech recognition engine receives digital speech signals representing received utterances and validates the utterances in accordance with an associated grammar file comprising rules defining command and control utterances that control the oscilloscope.

3. The system-of claim 2,
   wherein the associated grammar comprises rules specifying the syntax of predetermined command and control utterances.

4. The system of claim 2,
   wherein the predetermined command and control utterances comprise those utterances that control a specific model or version of the oscilloscope.

5. The system of claim 2,
wherein the associated grammar comprises a context-free grammar notation of rules specifying the syntax of the predetermined command and control utterances.

6. The system of claim 5,
wherein the syntax rules of the associated grammar are implemented in BNF format.

7. The system of claim 1,
wherein the speech recognition engine is configured to provide the measurement system controller with a textual representation of validated utterances.

8. The system of claim 7,
wherein the textual representation of the validated utterance is an ASCII string.

9. The system of claim 1, wherein the utterances can include a plurality of components, and wherein the system further comprises:
a natural language speech application interface (NLSAI) configured to parse each validated textual utterance and generate a token representing the command type along with command parameters contained within the text utterance.

10. The system of claim 9,
wherein the measurement controller generates system commands to control the oscilloscope based on the type of command and command parameters provided by the NLSAI and system state or configuration information as necessary to generate the system command.

11. The system-of claim 9,
wherein the NLSAI parses the utterance into its component parts using a natural language command and control corpus of possible utterances.

12. The system of claim 11, wherein the command and control corpus comprises command and control utterances for specifically controlling the oscilloscope.

13. The system of claim 1, wherein the oscilloscope further comprises:
a graphical user interface (GUI),
wherein the measurement system controller is configured to cause a rendering on the GUI of display messages indicating validated utterances.

14. The system of claim 1, wherein the oscilloscope further comprises:
a graphical user interface (GUI),
wherein the measurement system controller is further configured to generate display controls state changes to cause the GUI to change states of associated display elements that would occur on the GUI to effect a same control of the oscilloscope.

15. The system of claim 1, wherein the system further comprises:
a microphone that receives sound waves on which commands are carried, the microphone generating analog speech signals representing received sound waves; and
a speech digitizer that digitizes the analog speech signals to generate the digitized speech signals processed by the speech recognition engine.

16. The system of claim 1, wherein the system further comprises:
a speech generator that generates digital speech signals in response to speech commands,
wherein the measurement system controller is configured to generate speech commands representing validated utterances,
wherein the speech digitizer that converts the digital speech signals to analog speech signals that are coverted to sound waves by the microphone.

17. A voice controlled oscilloscope responsive to a command and control utterances, the oscilloscope comprising:
an oscilloscope subsystem constructed and arranged to perform signal measurement operations in response to received system command signals; and
a speech-responsive command and control system for enabling an operator to control the oscilloscope subsystem using voice commands, the control system selecting at least one command processor corresponding to a command in a received utterance, and generating system command signals, using the selected command processor, that cause the oscilloscope subsystem to perform functions implementing the command specified in the received utterance, wherein the command processors include at least one command processor related to a scale of a waveform displayed by the oscilloscope, at least one command processor related an offset of the displayed waveform, and at least one command processor related to a trigger.

18. The oscilloscope of claim 17, wherein the speech-responsive command and control system comprises:
a speech recognition engine that determines whether a digitized speech signal representing a received utterance is a valid command, wherein the speech recognition engine receives digital speech signals representing received utterances and validates the utterances in accordance with an associated grammar file comprising rules defining a set of predetermined command and control utterances that control the oscilloscope; and
a measurement system controller that generates the system command signals to control the oscilloscope to implement validated utterances.

19. The oscilloscope of claim 18,
wherein the predetermined command and control utterances comprise those utterances that control a specific model or version of the oscilloscope.

20. The oscilloscope of claim 18,
wherein the speech recognition engine is configured to provide the measurement system controller with a representation of validated utterances.

21. The oscilloscope of claim 18, wherein the utterance can include a plurality of components, and wherein the system further comprises:
a natural language speech application interface (NLSAI) configured to parse each validated utterance and generate a token representing the command type along with command parameters contained within the utterance.

22. The oscilloscope of claim 21,
wherein the NLSAI parses the utterance into its component parts using a natural language command and control corpus comprising command and control utterances for specifically controlling the oscilloscope.

23. The oscilloscope of claim 17, wherein the oscilloscope further comprises:
a graphical user interface (GUI),
wherein the measurement system controller is further configured to generate display controls state changes to cause the GUI to change states of associated display elements that would occur on the GUI to effect a same control of the oscilloscope.

24. A speech-responsive command and control system for enabling an operator to control an oscilloscope using voice commands, the control system comprising:
speech recognition engine means for determining whether a digitized speech signal representing a received utterance is a valid command; and measurement system control means for selecting at least one of a plurality of command processors corresponding to the valid command, and for controlling the oscilloscope, using the selected command processor, to implement the valid command, wherein the command processors comprise at least one command processor related to a scale of a waveform displayed by the oscilloscope, at least one command processor related an offset of the displayed waveform, and at least one command processor related to a trigger.

25. The system of claim 24, wherein the speech recognition engine means comprises:
means for receiving digital speech signals representing received utterances; and means for validating the utterances in accordance with an associated grammar file comprising rules defining command and control utterances that control the oscilloscope.

26. The system of claim 25,
wherein the associated grammar comprises rules specifying the syntax of predetermined command and control utterances for controlling the oscilloscope.

27. The system of claim 25, wherein the utterances can include a plurality of components, and wherein the system further comprises:
a natural language engine means for parsing each validated utterance and for generating a token representing the command type along with command parameters contained within the utterance, wherein the natural language engine parses the utterance into its component parts using a natural language command and control corpus comprising command and control utterances for controlling the oscilloscope.

28. The system of claim 24, wherein the speech recognition engine means comprises:
means for generating a representation of validated utterances for use by the measurement system control means.

29. The system of claim 24, wherein the oscilloscope further comprises:
a graphical user interface (GUI), and wherein the system further comprises:
means for rendering on the GUI display messages indicating validated utterances.
means for generating display controls state changes to cause the GUI to change states of associated display elements that would occur on the GUI to effect a same control of the oscilloscope.

30. A method for controlling an oscilloscope in response to voice commands, the method comprising:
receiving a command utterance generated by the operator;
digitizing the command utterance;
determining whether the digitized command utterance is a valid command and control utterance;
selecting at least one of a plurality of command processors corresponding to the valid command, wherein the plurality of command processors comprise at least one command processor related to a scale of a waveform displayed by the oscilloscope, at least one command processor related an offset of the displayed waveform, and at least one command processor related to a trigger; and
generating one or more system command signals, using the selected command processor, to cause the oscilloscope to perform one or more functions in response to the valid command and control utterance when the digitized command utterance is a valid command and control utterance.

31. The method of claim 30, wherein said determining whether the digitized command utterance is a valid command and control utterance comprises:
comparing said digitized command utterance with a predetermined grammar comprising rules defining valid command and control utterances.

32. The method of claim 30, wherein said generating one or more system command signals comprises:
obtaining oscilloscope state and configuration data as required to calculate command parameters of the system command,
wherein the one or more system command signals are generated based upon the obtained state and configuration data and the validated command utterance.

33. The method of claim 30, further comprising the step of:
displaying the command utterance on a display operatively coupled to the oscilloscope.

34. The method of claim 30, further comprising the step of:
receiving the command utterance through a microphone operatively coupled to the oscilloscope.

35. A signal measurement system comprising:
a signal acquisition subsystem configured to receive an electronic signal and determines information for use in displaying information regarding the received electronic signal;
a video display control subsystem configured to control displaying information on a graphical user interface in accordance with the information determined by the signal acquisition subsystem; and
a speech responsive command and control subsystem comprising:
a speech recognition engine configured to identify one or more valid commands included in a digitized speech signal; and
a measurement system controller comprising:
a validator configured to receive at least one token from the speech recognition engine regarding a valid command identified by the speech recognition engine;
a plurality of command processors each of which is configured to invoke one or more system commands in accordance with the received one or more tokens to cause the oscilloscope to perform one or more operations;
a command processor controller that is configured to access a command map to identify one or more command processors for processing the received token; and
a tutor configured to display one or more prompts on the graphical user interface requesting a user to speak a particular command, determine whether the received at least one token corresponds to the particular command, and display information on the graphical user interface regarding the whether received token corresponds to the particular command.

36. The oscilloscope of claim 35, wherein the plurality of command processors include at least one command processor related to a scale of a waveform displayed by the oscilloscope, at least one command processor related an offset of the displayed waveform, and at least one command processor related to a trigger; and wherein the measurement system controller.

* * * * *

UNITED STATES PATENT AND TRADEMARK OFFICE
CERTIFICATE OF CORRECTION

PATENT NO. : 7,027,991 B2
APPLICATION NO. : 10/107913
DATED : April 11, 2006
INVENTOR(S) : Alexander et al.

It is certified that error appears in the above-identified patent and that said Letters Patent is hereby corrected as shown below:

On the face page, in field (75), in "Inventors", in column 1, line 1, delete "Jay A Alexander," and
insert -- Jay A. Alexander, --, therefor.

On the face page, in field (75), in "Inventors", in column 1, line 2, delete "Michael J Karin," and
insert -- Michael J. Karin, --, therefor.

On the face page, in field (57), under "Abstract", in column 2, line 25, delete "an" and insert
-- and --, therefor.

In column 20, line 38, in Claim 1, delete "system-comprising:" and insert -- system comprising: --, therefor.

In column 20, line 59, In Claim 3, delete "system-of" and insert -- system of--, therefor.

In column 21, line 29, in Claim 11, delete "system-of" and insert -- system of --, therefor.

In column 21, line 67, in Claim 16, delete "coverted" and insert -- converted --, therefor.

In column 23, line 43, in Claim 29, delete "utterances." and
insert -- utterances; --, therefor.

In column 23, lines 63-64, In Claim 30, delete "oscilloscope-to" and insert -- oscilloscope to --, therefor.

In column 24, line 32, in Claim 35, delete "speech responsive" and insert -- speech-responsive --, therefor.

In column 24, line 56, in Claim 35, after "regarding" delete "the whether" and insert -- whether the --, therefor.

UNITED STATES PATENT AND TRADEMARK OFFICE
CERTIFICATE OF CORRECTION

PATENT NO. : 7,027,991 B2
APPLICATION NO. : 10/107913
DATED : April 11, 2006
INVENTOR(S) : Alexander et al.

It is certified that error appears in the above-identified patent and that said Letters Patent is hereby corrected as shown below:

In column 24, line 56, in Claim 35, after "regarding" delete "the whether" and insert -- whether the --, therefor.

Signed and Sealed this

Twenty-first Day of November, 2006

JON W. DUDAS
*Director of the United States Patent and Trademark Office*